United States Patent
Noble et al.

(10) Patent No.: US 6,476,434 B1
(45) Date of Patent: Nov. 5, 2002

(54) 4 $F^2$ FOLDED BIT LINE DRAM CELL STRUCTURE HAVING BURIED BIT AND WORD LINES

(75) Inventors: Wendell P. Noble, Milton, VT (US); Leonard Forbes, Corvallis, OR (US); Kie Y. Ahn, Chappaqua, NY (US)

(73) Assignee: Micron Tecnology, Inc., Boise, ID (US)

(*) Notice: Subject to any disclaimer, the term of this patent is extended or adjusted under 35 U.S.C. 154(b) by 0 days.

(21) Appl. No.: 09/571,352

(22) Filed: May 16, 2000

Related U.S. Application Data

(63) Continuation of application No. 08/889,463, filed on Jul. 8, 1997, now Pat. No. 6,072,209.

(51) Int. Cl.[7] ............................................. H01L 27/108
(52) U.S. Cl. ..................... 257/302; 257/296; 257/306; 257/330; 257/334; 438/242; 438/244; 438/253; 438/387; 438/396
(58) Field of Search ................. 257/296, 302, 257/306, 330, 334, 907; 438/238, 239, 242, 244, 253, 386, 387, 396, 399, 259, 270, 271, 589

(56) References Cited

U.S. PATENT DOCUMENTS

| | | | |
|---|---|---|---|
| 3,657,575 A | 4/1972 | Taniguchi et al. | 307/304 |
| 3,806,741 A | 4/1974 | Smith | 307/304 |
| 4,051,354 A | 9/1977 | Choate | 235/312 |
| 4,252,579 A | 2/1981 | Ho et al. | 438/239 |
| 4,604,162 A | 8/1986 | Sobczak | 156/657 |
| 4,630,088 A | 12/1986 | Ogura et al. | 357/23.6 |
| 4,663,831 A | 5/1987 | Birrittella et al. | 29/576 E |
| 4,673,962 A | 6/1987 | Chatterjee et al. | 357/23.6 |
| 4,740,826 A | 4/1988 | Chatterjee | 357/42 |
| 4,761,768 A | 8/1988 | Turner et al. | 365/201 |
| 4,766,569 A | 8/1988 | Turner et al. | 365/185 |
| 4,920,065 A | 4/1990 | Chin et al. | 437/52 |
| 4,929,988 A | 5/1990 | Yoshikawa | 257/316 |

(List continued on next page.)

FOREIGN PATENT DOCUMENTS

| | | | | |
|---|---|---|---|---|
| JP | 363066963 A | | 3/1988 | 257/305 |
| JP | 11135757 A | * | 5/1999 | H01L/27/108 |
| JP | 2000-164883 | | 6/2000 | H01L/29/786 |

OTHER PUBLICATIONS

Adler, E., et al., "The Evolution of IBM CMOS DRAM Technology", 167–188, (Jan./Mar., 1995).

Asai, S., et al., "Technology Challenges for Integration Near and Below 0.1 micrometer", *Proceedings of the IEEE, 85,* Special Issue on Nanometer–Scale Science & Technology, 505–520, (Apr. 1997).

(List continued on next page.)

*Primary Examiner*—Nathan Flynn
*Assistant Examiner*—Scott R Wilson
(74) *Attorney, Agent, or Firm*—Schwegman, Lundberg, Woessner & Kluth, P.A.

(57) ABSTRACT

A memory cell structure for a folded bit line memory array of a dynamic random access memory device includes buried bit and word lines, with the access transistors being formed as a vertical structure on the bit lines. Isolation trenches extend orthogonally to the bit lines between the access transistors of adjacent memory cells, and a pair of word lines are located in each of the isolation trenches. The word lines are oriented vertically widthwise in the trench and are adapted to gate alternate access transistors, so that both an active and a passing word line can be contained within each memory cell to provide a folded bit line architecture. The memory cell has a surface area that is approximately 4 $F^2$, where F is a minimum feature size. Also disclosed are processes for fabricating the DRAM cell using bulk silicon or a silicon on insulator processing techniques.

27 Claims, 10 Drawing Sheets

U.S. PATENT DOCUMENTS

| | | | |
|---|---|---|---|
| 4,949,138 A | 8/1990 | Nishimura | 357/23.6 |
| 4,958,318 A | 9/1990 | Harari | 365/149 |
| 4,987,089 A | 1/1991 | Roberts | 437/34 |
| 5,001,526 A | 3/1991 | Gotou | 357/23.6 |
| 5,006,909 A | 4/1991 | Kosa | 357/23.6 |
| 5,017,504 A | 5/1991 | Nishimura et al. | 437/40 |
| 5,021,355 A | 6/1991 | Dhong et al. | 437/35 |
| 5,028,977 A | 7/1991 | Kenneth et al. | 357/43 |
| 5,057,896 A | 10/1991 | Gotou | 357/49 |
| 5,072,269 A | 12/1991 | Hieda | 357/23.6 |
| 5,102,817 A | 4/1992 | Chatterjee et al. | 437/47 |
| 5,110,752 A | 5/1992 | Lu | 437/47 |
| 5,128,831 A | 7/1992 | Fox, III et al. | |
| 5,140,388 A | 8/1992 | Bartelink | 357/23.4 |
| 5,156,987 A | 10/1992 | Sandhu et al. | 437/40 |
| 5,177,028 A | 1/1993 | Manning | 437/41 |
| 5,177,576 A | 1/1993 | Kimura et al. | 257/71 |
| 5,202,278 A | 4/1993 | Mathews et al. | 437/47 |
| 5,208,657 A | 5/1993 | Chatterjee et al. | 257/302 |
| 5,216,266 A | 6/1993 | Ozaki | 257/302 |
| 5,223,081 A | 6/1993 | Doan | 156/628 |
| 5,266,514 A | 11/1993 | Tuan et al. | 437/52 |
| 5,276,343 A | 1/1994 | Kumagai et al. | 257/306 |
| 5,292,676 A | 3/1994 | Manning | 437/46 |
| 5,316,962 A | 5/1994 | Matsuo et al. | 437/52 |
| 5,320,880 A | 6/1994 | Sandhu et al. | 427/578 |
| 5,327,380 A | 7/1994 | Kersh, III et al. | 365/195 |
| 5,376,575 A | 12/1994 | Kim et al. | 437/52 |
| 5,379,255 A | 1/1995 | Shah | 365/185 |
| 5,382,540 A | 1/1995 | Sharma et al. | 437/52 |
| 5,385,854 A | 1/1995 | Batra et al. | 437/41 |
| 5,391,911 A | 2/1995 | Beyer et al. | 257/522 |
| 5,392,245 A | 2/1995 | Manning | 365/200 |
| 5,393,704 A | 2/1995 | Huang et al. | 437/203 |
| 5,396,093 A | 3/1995 | Lu | 257/306 |
| 5,409,563 A | 4/1995 | Cathey | 156/643 |
| 5,410,169 A | 4/1995 | Yamamoto et al. | 257/301 |
| 5,414,287 A | 5/1995 | Hong | 257/316 |
| 5,422,499 A | 6/1995 | Manning | 257/67 |
| 5,427,972 A | 6/1995 | Shimizu et al. | 437/52 |
| 5,432,739 A | 7/1995 | Pein | 365/185 |
| 5,438,009 A | 8/1995 | Yang et al. | 437/52 |
| 5,440,158 A | 8/1995 | Sung-Mu | 257/314 |
| 5,443,992 A | 8/1995 | Risch et al. | 437/29 |
| 5,445,986 A | 8/1995 | Hirota | 437/60 |
| 5,451,538 A | 9/1995 | Fitch, et al. | 438/253 |
| 5,451,889 A | 9/1995 | Heim et al. | 326/81 |
| 5,460,316 A | 10/1995 | Hefele | 228/39 |
| 5,460,988 A | 10/1995 | Hong | 437/83 |
| 5,466,625 A | 11/1995 | Hsieh et al. | 437/52 |
| 5,483,094 A | 1/1996 | Sharma et al. | 257/316 |
| 5,483,487 A | 1/1996 | Sung-Mu | 365/185.33 |
| 5,492,853 A | 2/1996 | Jeng et al. | 437/60 |
| 5,495,441 A | 2/1996 | Hong | 365/185.01 |
| 5,497,017 A * | 3/1996 | Gonzales | 257/306 |
| 5,502,629 A | 3/1996 | Ito et al. | 363/60 |
| 5,504,357 A | 4/1996 | Kim et al. | 257/306 |
| 5,508,219 A | 4/1996 | Bronner et al. | 437/52 |
| 5,508,542 A | 4/1996 | Geiss et al. | 257/301 |
| 5,519,236 A | 5/1996 | Ozaki | 257/302 |
| 5,528,062 A | 6/1996 | Hsieh et al. | 257/298 |
| 5,563,083 A | 10/1996 | Pein | 437/43 |
| 5,574,299 A | 11/1996 | Kim | 257/296 |
| 5,593,912 A | 1/1997 | Rajeevakumar | 437/52 |
| 5,612,559 A * | 3/1997 | Park et al. | 257/302 |
| 5,616,934 A | 4/1997 | Dennison et al. | 257/67 |
| 5,627,390 A | 5/1997 | Maeda et al. | 257/302 |
| 5,640,342 A | 6/1997 | Gonzalez | 365/156 |
| 5,641,545 A | 6/1997 | Sandhu | 427/573 |
| 5,644,540 A | 7/1997 | Manning | 365/200 |
| 5,646,900 A | 7/1997 | Tsukude et al. | 365/205 |
| 5,691,230 A | 11/1997 | Forbes | 437/62 |
| 5,705,415 A | 1/1998 | Orlowski et al. | 437/43 |
| 5,707,885 A | 1/1998 | Lim | 437/52 |
| 5,753,947 A | 5/1998 | Gonzalez | 257/296 |
| 5,789,967 A | 8/1998 | Katoh | 327/408 |
| 5,821,796 A | 10/1998 | Yaklin et al. | 327/313 |
| 5,852,375 A | 12/1998 | Byrne et al. | 327/108 |
| 5,874,760 A | 2/1999 | Burns, Jr. et al. | 257/315 |
| 5,879,971 A | 3/1999 | Witek | 438/238 |
| 5,943,267 A | 8/1999 | Sekariapuram et al. | 365/185.28 |
| 5,981,995 A | 11/1999 | Selcuk | 257/330 |
| 6,040,210 A * | 3/2000 | Burns, Jr, et al. | 438/238 |
| 6,040,218 A | 3/2000 | Lam | 438/259 |
| 6,072,209 A | 6/2000 | Noble et al. | 257/296 |
| 6,150,687 A | 11/2000 | Noble et al. | 257/302 |
| 6,165,836 A | 12/2000 | Forbes et al. | 438/243 |
| 6,172,391 B1 | 1/2001 | Goebel | 257/305 |
| 6,221,788 B1 | 4/2001 | Kobayashi et al. | 438/762 |
| 6,255,708 B1 | 7/2001 | Sudharsanan et al. | 257/428 |

OTHER PUBLICATIONS

Askin, H.O., et al., "Fet Device Parameters Compensation Circuit", *IBM Technical Disclosure Bulletin*, 14, 2088–2089, (Dec. 1971).

Banerjee, S.K., et al., "Characterization of Trench Transistors for 3–D Memories", *1986 Symposium on VLSI Technology, Digest of Technical Papers*, San Diego, CA, 79–80, (May 28–30, 1986).

Blalock, T.N., et al., "A High–Speed Sensing Scheme for 1T Dynamic RAM's Utilizing the Clamped Bit–Line Sense Amplifier", *IEEE Journal of Solid–State Circuits*, 27(4), pp. 618–624, (Apr. 1992).

Bomchil, G., et al., "Porous Silicon: The Material and its Applications in Silicon–On–Insulator Technologies", *Applied Surface Science*,41/42, 604–613, (1989).

Burnett, D., et al., "Implications of Fundamental Threshold Voltage Variations for High–Density SRAM and Logic Circuits", *1994 Symposium on VLSI Technology, Digest of Technical Papers*, Honolulu, HI, 15–16, (Jun. 4–7, 1994).

Burnett, D., et al., "Statistical Threshold–Voltage Variation and its Impact on Supply–Voltage Scaling", *Proceedings SPIE: Microelectronic Device and Multilevel Interconnection Technology*, 2636, 83–90, (1995).

Chen, M., et al., "Back–Gate Forward Bias Method for Low Voltage CMOS Digital Cicuits", *IEEE Transactions on Electron Devices*, 43, 904–909, (1996).

Chen, M.J., et al., "Back–Gate Forward Bias Method for Low–Voltage CMOS Digital Cicuits", *IEEE Transactions on Electron Devices*, 43, 904–909, (Jun. 1986).

Chen, M.J., et al., "Optimizing the Match in Weakly Inverted MOSFET's by Gated Lateral Bipolar Action", *IEEE Transactions on Electron Devices*, 43, 766–773 (May 1996).

Chung, I.Y., et al., "A New SOI Inverter for Low Power Applications", *Proceedings of the 1996 IEEE International SOI Conference*, Sanibel Island, FL, 20–21, (Sep. 30–Oct. 3, 1996).

Clemen, R., et al., "VT–compensated TTL–Compatible Mos Amplifier", *IBM Technical Disclosure Bulletin*, 21, 2874–2875, (1978).

De, V.K., et al., "Random MOSFET Parameter Fluctuation Limits to Gigascale Integration (GSI)", *1996 Symposium on VLSI Technology, Digest of Technical Papers*, Honolulu, HI, 198–199, (Jun. 11–13, 1996).

De, V.K., et al., "Random Mosfet Parameter Fluctuation Limits to Gigascale Integration (GST)", *Symposium on VLSI Technology Digest of Technical Papers*, 198–199, (1996).

DeBar, D.E., "Dynamic Substrate Bias to Achieve Radiation Hardening", *IBM Technical Disclosure Bulletin*, 25, 5829–5830, (1983).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17(11), 509–511, (Nov. 1996).

Fong, Y., et al., "Oxides Grown on Textured Single–Crystal Silicon—Dependence on Process and Application in EEPROMs", *IEEE Transactions on Electron Devices*, 37(3), pp. 583–590, (Mar. 1990).

Forbes, L., "Automatic On–clip Threshold Voltage Compensation", *IBM Technical Disclosure Bulletin*, 14, 2894–2895, (1972).

Forbes, L., et al., "Resonant Forward–Biased Guard–Ring Diodes for Suppression of Substrate Noise in Mixed–Mode CMOS Circuits", *Electronics Letters*, 31, 720–721, (Apr. 1995).

Foster, R., et al., "High Rate Low–Temperature Selective Tungsten", In: *Tungsten and Other Refractory Metals for VLSI Applications III*, V.A. Well ed., Materials Res. Soc., Pittsburgh, PA, 69–72, (1988).

Frantz, H., et al., "Mosfet Substrate Bias–Voltage Generator", *IBM Technical Disclosure Bulletin*, 11, 1219–1220, (Mar. 1969).

Fuse, T., et al., "A. 0.5V 200MHz 1–Stage 32b ALU Using a Body Bias Controlled SOI Pass–Gate Logic", *1997 IEEE International Solid–State Circuits Conference, Digest of Technical Papers*, 286–287, (1997).

Gong, S., et al., "Techniques for Reducing Switching Noise in High Speed Digital Systems", *Proceedings of the 8th Annual IEEE International ASIC Conference and Exhibit*, Austin, TX, 21–24, (1995).

Hao, M.Y., et al., "Electrical Characteristics of Oxynitrides Grown on Textured Single–Crystal Silicon", *Appl. Phys. Lett.*, 60, 445–447, (Jan. 1992).

Harada, M., et al., "Suppression of Threshold Voltage Variation in MTCMOS/SIMOX Circuit Operating Below 0.5 V", *1996 Symposium on VLSI Technology, Digest of Technical Papers*, Honolulu, HI, 96–97, (Jun. 11–13, 1996).

Heavens, O., *Optical Properties of Thin Solid Films*, Dover Pubs. Inc., New York, 167, (1965).

Hisamoto, D., et al., "A New Stacked Cell Structure for Giga–Bit DRAMs using Vertical Ultra–Thin SOI (DELTA) MOSFETs", *1991 IEEE International Electron Devices Meeting, Technical Digest*, Washington, D.C., 959–961, (Dec. 8–11, 1991).

Hodges, D.A., et al., "MOS Decoders", In: *Analysis and Design of Digital Integrated Circuits*, 2nd Edition, Section: 9.1.3 354–357, (1988).

Holman, W.T., et al., "A Compact Low Noise Operational Amplifier for a 1.2 Micrometer Digital CMOS Technology", *IEEE Journal of Solid–State Circuits*, 30, 710–714, (Jun. 1995).

Horie, H., et al., "Novel High Aspect Ratio Aluminum Plug for Logic/DRAM LSI's Using Polysilicon–Aluminum Substitute", *Technical Digest: IEEE International Electron Devices Meeting*, San Francisco, CA, 946–948, (1996).

Hu, G., et al., "Will Flash Memory Replace Hard Disk Drive?", *1994 IEEE International Electron Device Meeting*, Panel Discussion, Session 24, Outline, 1 p., (Dec. 13, 1994).

Huang, W.L., et al., "TFSOI Complementary BiCMOS Technology for Low Power Applications", *IEEE Transactions on Electron Devices*, 42, 506–512, (Mar. 1995).

Jun, Y.K., et al., "The Fabrication and Electrical Properties of Modulated Stacked Capacitor for Advanced DRAM Applications", *IEEE Electron Device Letters*, 13, 430–432, (Aug. 1992).

Jung, T.S., et al., "A 117–MM2 3.3–V Only 128–Mb Multilevel NAND Flash Memory for Mass Storage Applications", *IEEE Journal of Solid–State Circuits*, 31, 1575–1582, (Nov. 1996).

Kang, H.K., et al., "Highly Manufacturable Process Technology for Reliable 256 Mbit and 1Gbit DRAMs", *IEEE International Electron Devices Meeting, Technical Digest*, San Francisco, CA, 635–638, (Dec. 11–14, 1994).

Kim, Y.S., et al., "A Study on Pyrolysis DMEAA for Selective Deposition of Aluminum", In: *Advanced Metallization and Interconnect Systems for ULSI Applications in 1995*, R.C. Ellwanger, et al., (eds.), Materials Research Society, Pittsburgh, PA, 675–680, (1996).

Kishimoto, T., et al., "Well Structure by High–Energy Boron Implantation for Soft–Error Reduction in Dynamic Random Access Memories (DRAMs)", *Japanese Journal of Applied Physics*, 34, 6899–6902, (Dec. 1995).

Klaus, et al., "Atomic Layer Controlled Growth of SiO2 Films Using Binary Reaction Sequence Chemistry", *Applied Physics Lett.* 70(9), 1092–94, (Mar. 3, 1997).

Kohyama, Y., et al., "Buried Bit–Line Cell for 64MB DRAMs", *1990 Symposium on VLSI Technology, Digest of Technical Papers*, Honolulu, HI, 17–18, (Jun. 4–7, 1990).

Koshida, N., et al., "Efficient Visible Photoluminescence from Porous Silicon", *Japanese Journal of Applied Physics*, 30, L1221–L1223, (Jul. 1991).

Kuge, S., et al., "SOI–DRAM Circuit Technologies for Low Power High Speed Multigiga Scale Memories", *IEEE Journal of Solid–State Circuits*, 31(4), pp. 586–591, (Apr. 1996).

Lantz, II, L., "Soft Errors Induced By Alpha Particles", *IEEE Transactions on Reliability*, 45, 174–179, (Jun. 1996).

Lehmann, et al., "A Novel Capacitor Technology Based on Porous Silicon", *Thin Solid Films 276, Elsevier Science*, 138–42, (1996).

Lehmann, V., "The Physics of Macropore Formation in Low Doped n–Type Silicon", *Journal of the Electrochemical Society*, 140(10), 2836–2843, (Oct. 1993).

Lu, N., et al., "The SPT Cell—A New Substrate–Plate Trench Cell for DRAMs", *1985 IEEE International Electron Devices Meeting, Technical Digest*, Washington, D.C., 771–772, (Dec. 1–4, 1985).

MacSweeney, D., et al., "Modeling of Lateral Bipolar Devices in a CMOS Process", *IEEE Bipolar Circuits and Technology Meeting*, Minneapolis, MN, 27–30, (Sep. 1996).

Maeda, S., et al., "A Vertical Phi–Shape Transistor (VPhiT) Cell for 1 Gbit DRAM and Beyond", *1994 Symposium of VLSI Technology, Digest of Technical Papers*, Honolulu, HI, 133–134, (Jun. 7–9, 1994).

Maeda, S., et al., "Impact of a Vertical Phi–Shape Transistor (VPhiT) Cell for 1 Gbit DRAM and Beyond", *IEEE Transactions on Electron Devices*, 42, 2117–2123, (Dec. 1995).

Malaviya, S., *IBM TBD*, 15, p. 42, (Jul. 1972).

Masu, K., et al., "Multilevel Metallization Based on A1 CVD", *1996 IEEE Symposium on VLSI Technology, Digest of Technical Papers*, Honolulu, HI, 44–45, (Jun. 11–13, 1996).

McCredie, B.D., et al., "Modeling, Measurement, and Simulation of Simultaneous Switching Noise", *IEEE Transactions on Components, Packaging, and Manufacturing Technology—Part B*, 19, 461–472, (Aug. 1996).

Muller, K., et al., "Trench Storage Node Technology for Gigabit DRAM Generations", *Digest IEEE International Electron Devices Meeting*, San Francisco, CA, 507–510, (Dec. 1996).

Nitayama, A., et al., "High Speed and Compact CMOS Circuits with Multipillar Surrounding Gate Transistors", *IEEE Transactions on Electron Devices*, 36, 2605–2606, (Nov. 1989).

Ohba, T., et al., "Evaluation on Selective Deposition of CVD W Films by Measurement of Surface Temperature", *In: Tungsten and Other Refractory Metals for VLSI Applications II*, Materials Research Society, Pittsburgh, PA, 59–66, (1987).

Ohba, T., et al., "Selective Chemical Vapor Deposition of Tungsten Using Silane and Polysilane Reductions", *In: Tungsten and Other Refractory Metals for VLSI Applications IV*, Materials Research Society, Pittsburgh, PA, 17–25, (1989).

Ohno, Y., et al., "Estimation of the Charge Collection for the Soft–Error Immunity by the 3D–Device Simulation and the Quantitative Investigation", *Simulation of Semiconductor Devices and Processes*, 6, 302–305, (Sep. 1995).

Oowaki, Y., et al., "New alpha–Particle Induced Soft Error Mechanism in a Three Dimensional Capacitor Cell", *IEICE Transactions on Electronics*, 78–C, 845–851, (Jul. 1995).

Oshida, S., et al., "Minority Carrier Collection in 256 M–bit DRAM Cell on Incidence of Alpha–Particle Analyzed by Three–Dimensional Device Simulation", *IEICE Transactions on Electronics*, 76–C, 1604–1610, (Nov. 1993).

Ott, A.W., et al., "A1303 Thin Film Growth on Si(100) Using Binary Reaction Sequence Chemistry", *Thin Solid Films*, vol. 292, 135–44, (1997).

Ozaki, T., et al., "A Surrounding Isolation–Merged Plate Electrode (SIMPLE) Cell with Checkered Layout for 256Mbit DRAMs and Beyond", *1991 IEEE International Electron Devices Meeting*, Washington, D.C., 469–472, (Dec. 8–11, 1991).

Parke, S.A., et al., "A High–Performance Lateral Bipolar Transistor Fabricated on SIMOX", *IEEE Electron Device Letters*, 14, 33–35, (Jan. 1993).

Pein, H., et al., "A 3–D Sidewall Flash EPROM Cell and Memory Array", *IEEE Transactions on Electron Devices*, 40, 2126–2127, (Nov. 1993).

Pein, H., et al., "Performance of the 3–D PENCIL Flash EPROM Cell and Memory Array", *IEEE Transactions on Electron Devices*, 42, 1982–1991, (Nov., 1995).

Pein, H.B., et al., "Performance of the 3–D Sidewall Flash EPROM Cell", *IEEE International Electron Devices Meeting, Technical Digest*, 11–14, (1993).

Puri, Y., "Substrate Voltage Bounce in NMOS Self–biased Substrates", *IEEE Journal of Solid–State Circuits, SC–13*, 515–519, (Aug. 1978).

Ramo, S., et al., *Fields and Waves in Communication Electronics, Third Edition*, John Wiley & Sons, Inc., pp. 428–433, (1994).

Rao, K.V., et al., "Trench Capacitor Design Issues in VLSI DRAM Cells", *1986 IEEE International Electron Devices Meeting, Technical Digest*, Los Angeles, CA, 140–143, (Dec. 7–10, 1986).

Richardson, W.F., et al., "A Trench Transistor Cross–Point DRAM Cell" *IEEE International Electron Devices Meeting*, Washington, D.C., 714–717, (Dec. 1–4, 1985).

Sagara, K., et al., "A 0.72 micro–meter2 Recessed STC (RSTC) Technology for 256Mbit DRAMs using Quarter–Micron Phase–Shift Lithography", *1992 Symposium on VLSI Technology, Digest of Technical Papers*, Seattle, WA, 10–11, (Jun. 2–4, 1992).

Saito, M., et al., "Technique for Controlling Effective Vth in Multi–Gbit DRAM Sense Amplifier", *1996 Symposium on VLSI Circuits, Digest of Technical Papers*, Honolulu, HI, 106–107, (Jun. 13–15, 1996).

Seevinck, E., et al., "Current–Mode Techniques for High–Speed VLSI Circuits with Application to Current Sense Amplifier for CMOS SRAM's", *IEEE Journal of Solid State Circuits*, 26(4), pp. 525–536, (Apr. 1991).

Senthinathan, R., et al., "Reference Plane Parasitics Modeling and Their Contribution to the Power and Ground Path "Effective" Inductance as Seen by the Output Drivers", *IEEE Transactions on Microwave Theory and Techniques*, 42, 1765–1773, (Sep. 1994).

Shah, A.H., et al., "A 4–Mbit DRAM with Trench–Transistor Cell", *IEEE Journal of Solid–State Circuits, SC–21*, 618–625, (Oct. 1986).

Shah, A.H., et al., "A 4Mb DRAM with Cross–Point Trench Transistor Cell", *1986 IEEE International Solid–State Circuits Conference, Digest of Technical Papers*, 268–269, (Feb. 21, 1986).

Sherony, M.J., et al., "Reduction of Threshold Voltage Sensitivity in SOI MOSFET's", *IEEE Electron Device Letters*, 16, 100–102, (Mar. 1995).

Shimomura, K., et al., "A 1V 46ns 16Mb SOI–DRAM with Body Control Technique", *1997 IEEE International Solid–State Circuits Conference, Digest of Technical Papers*, 68–69, (Feb. 6, 1997).

Stanisic, B.R., et al., "Addressing Noise Decoupling in Mixed–Signal IC's: Power Distribution Design and Cell Customization", *IEEE Journal of Solid–State Circuits*, 30, 321–326, (Mar. 1995).

Stellwag, T.B., et al., "A Vertically–Integrated GaAs Bipolar DRAM Cell", *IEEE Transactions on Electron Devices*, 38, 2704–2705, (Dec. 1991).

Su, D.K., et al., "Experimental Results and Modeling Techniques for Substrate Noise in Mixed–Signal Integrated Circuits", *IEEE Journal of Solid–State Circuits*, 28(4), 420–430, (Apr. 1993).

Suma, K., et al., "An SOI–DRAM with Wide Operating Voltage Range by CMOS/SIMOX Technology", *IEEE Journal of Solid–State Circuits*, 29(11), pp. 1323–1329, (Nov. 1994).

Sun, J., "CMOS Technology for 1.8V and Beyond", *Int'l Symp. on VLSI Technology, Systems and Applications: Digest of Technical Papers*, 293–297, (1997).

Sunouchi, K., et al., "A Surrounding Gate Transistor (SGT) Cell for 64/256Mbit DRAMs", *1989 IEEE International Electron Devices Meeting, Technical Digest*, Washington, D.C., 23–26, (Dec. 3–6, 1989).

Sunouchi, K., et al., "Process Integration for 64M DRAM Using an Asymmetrical Stacked Trench Capacitor (AST) Cell", *1990 IEEE International Electron Devices Meeting*, San Francisco, CA, 647–650, (Dec. 9–12, 1990).

Suntola, T., "Atomic Layer Epitaxy", *Handbook of Crystal Growth 3, Thin Films of Epitaxy, Part B: Growth Mechanics and Dynamics, Elsevier, Amsterdam*, 601–63, (1994).

Sze, S.M., *VLSI Technology, 2nd Edition*, Mc Graw–Hill, NY, 90, (1988).

Takai, M., et al., "Direct Measurement and Improvement of Local Soft Error Susceptibility in Dynamic Random Access Memories", *Nuclear Instruments & Methods in Physics Research*, B–99, Proceedings of the 13th International Conference on the Application of Accelerators in Research and Industry, Denton, TX, 562–565, (Nov. 7–10, 1994).

Takao, Y., et al., "A 4–um(2) Full–CMOS SRAM Cell Technology for 0.2–um High Performance Logic LSIs", *1997 Symp. on VLSI Technology: Digest of Technical Papers*, Kyoto, Japan, 11–12, (1997).

Takato, H., et al., "High Performance CMOS Surrounding Gate Transistor (SGT) for Ultra High Density LSIs", *IEEE International Electron Devices Meeting, Technical Digest*, 222–225, (1988).

Takato, H., et al., "Impact of Surrounding Gate Transistor (SGT) for Ultra–High Density LSI's", *IEEE Transactions on Electron Devices*, 38, 573–578, (Mar. 1991).

Tanabe, N., et al., "A Ferroelectric Capacitor Over Bit–Line (F–COB) Cell for High Density Nonvolatile Ferroelectric Memories", *1995 Symposium on VLSI Technology, Digest of Technical Papers*, Kyoto, Japan, 123–124, (Jun. 6–8, 1995).

Temmler, D., "Multilayer Vertical Stacked Capacitors (MVSTC) for 64Mbit and 256Mbit DRAMs", *1991 Symposium on VLSI Technology, Digest of Technical Papers*, Oiso, 13–14, (May 28–30, 1991).

Terauchi, M., et al., "A Surrounding Gate Transistor (SGT) Gain Cell for Ultra High Density DRAMs", *1993 Symposium on VLSI Technology, Digest of Technical Papers*, Kyoto, Japan, 21–22, (1993).

Tsui, P.G., et al., "A Versatile Half–Micron Complementary BiCMOS Technology for Microprocessor–Based Smart Power Applications", *IEEE Transactions on Electron Devices*, 42, 564–570, (Mar. 1995).

Verdonckt–Vandebroek, S., et al., "High–Gain Lateral Bipolar Action in a MOSFET Structure", *IEEE Transactions on Electron Devices* 38, 2487–2496, (Nov. 1991).

Vittal, A., et al., "Clock Skew Optimization for Ground Bounce Control", *1996 IEEE/ACM International Conference on Computer–Aided Design, Digest of Technical Papers*, San Jose, CA, 395–399, (Nov. 10–14, 1996).

Wang, N., *Digital MOS Integrated Circuits*, Prentice Hall, Inc., Englewood Cliffs, NJ, p. 328–333, (1989).

Wang, P.W., et al., "Excellent Emission Characteristics of Tunneling Oxides Formed Using Ultrathin Silicon Films for Flash Memory Devices", *Japanese Journal of Applied Physics*, 35, 3369–3373, (Jun. 1996).

Watanabe, H., et al., "A New Cylindrical Capacitor Using Hemispherical Grained Si (HSG–Si) for 256Mb DRAMs", *IEEE International Electron Devices Meeting, Technical Digest*, San Francisco, CA, 259–262, (Dec. 13–16, 1992).

Watanabe, H., et al., "A Novel Stacked Capacitor with Porous–Si Electrodes for High Density DRAMs", *1993 Symposium on VLSI Technology, Digest of Technical Papers*, Kyoto, Japan, 17–18, (1993).

Watanabe, H., et al., "An Advanced Fabrication Technology of Hemispherical Grained (HSG) Poly–Si for High Capacitance Storage Electrodes", *Extended Abstracts of the 1991 International Conference on Solid State Devices and Materials*, Yokohama, Japan, 478–480, (1991).

Watanabe, H., et al., "Device Application and Structure Observation for Hemispherical–Grained Si", *J. Appl. Phys.*, 71, 3538–3543, (Apr. 1992).

Watanabe, H., et al., "Hemispherical Grained Silicon (HSG–Si) Formation on In–Situ Phosphorous Doped Amorphous–Si Using the Seeding Method" *Extended Abstracts of the 1992 International Conference on Solid State Devices and Materials*, Tsukuba, Japan, 422–424, (1992).

Watanabe, S., et al., "A Novel Circuit Technology with Surrounding Gate Transistors (SGT's) for Ultra High Density DRAM's)", *IEEE Journal of Solid–State Circuits*, 30, 960–971, (Sep. 1995).

Wooley, et al., "Experimental Results and Modeling Techniques for Substrate Noise in Mixed Signal Integrated Circuits", *IEEE Journal of Solid State Circuits*, vol. SC–28, 420–30, (1993).

Yamada, T., et al., "A New Cell Structure with a Spread Source/Drain (SSD) MOSFET and a Cylindrical Capacitor for 64–Mb DRAM's", *IEEE Transactions on Electron Devices*, 38, 2481–2486, (Nov. 1991).

Yamada, T., et al., "Spread Source/Drain (SSD) MOSFET Using Selective Silicon Growth for 64Mbit DRAMs", *1989 IEEE International Electron Devices Meeting, Technical Digest*, Washington, D.C., 35–38, (Dec. 3–6, 1989).

Yoshikawa, K., "Impact of Cell Threshold Voltage Distribution in the Array of Flash Memories on Scaled and Multilevel Flash Cell Design", *1996 Symposium on VLSI Technology, Digest of Technical Papers*, Honolulu, HI, 240–241, (Jun. 11–13, 1996).

* cited by examiner ial
4 F² FOLDED BIT LINE DRAM CELL STRUCTURE HAVING BURIED BIT AND WORD LINES This application is a continuation of U.S. Ser. No. 08/889,463, filed Jul. 8, 1997 now U.S. Pat. No. 6,072,209.

FIELD OF THE INVENTION

The present invention relates generally to semiconductor memory devices, and in particular, the present invention relates to a folded bit line memory cell structure including buried bit and word lines for a dynamic random access memory device.

BACKGROUND OF THE INVENTION

The memory cells of dynamic random access memories (DRAMs) are comprised of two main components, a field-effect transistor (FET) and a capacitor which functions as a storage element The need to increase the storage capability of semiconductor memory devices has led to the development of very large scale integrated (VLSI) cells which provides a substantial increase in component density.

However, the extension of dynamic random access memories beyond the megabit range has placed large demands on the storage capacitance in single transistor memory cells. The problem is compounded by the trend for reduction in power supply voltages which results in stored charge reduction and leads to degradation of immunity to alpha particle induced soft errors, both of which require that the storage capacitance be even larger. As the cell size for dynamic random access memory (DRAM) cells is reduced to that necessary for Gigabit density and greater, there are three major impediments to cell size reduction which can be overcome only by significant innovation in the cell structure.

Cell structures used through the 256 Megabit generation have been fundamentally limited to a size of at least 8 F², where F is a minimum lithographic feature size. This size limitation is imposed by the wiring requirements of passing both an active and passing word lines through the cell to achieve the low noise benefits of folded bit line architecture. This limitation can be removed by either relinquishing the folded bit line architecture or by devising a sub lithographic wiring technique. A further limitation is imposed by the area required to form the source region, the drain region and the channel region of the FET array device on a planar surface. Another limitation is imposed by the area that is required for fabricating the storage capacitor which, in a stacked capacitor technology, must compete with the bit line and word line wiring for space above the silicon surface.

For the reasons stated above, and for other reasons stated below which will become apparent to those skilled in the art upon reading and understanding the present specification, there is a need in the art for a memory cell structure for a semiconductor memory device, such as dynamic random access memory device, which employs a folded bit line architecture and in which the surface area of the memory cells is minimized, providing a memory cell structure that is less than 8 F² in size, resulting in increased density for the memory device.

SUMMARY OF THE INVENTION

The present invention provides a memory array cell structure for a semiconductor memory device. The memory array includes buried bit and word lines, and access transistors are formed as vertical structures on the bit lines. Isolation trenches extend orthogonally to the bit lines between the access transistors of adjacent memory cells. First and second word lines, which are located in each of the isolation trenches, are adapted to gate alternate ones of the access transistors located adjacent to the trench, allowing both an active and a passing word line to be contained within each memory cell, thereby providing a folded bit line architecture for the memory array. The width of the access transistors is determined by the width F of the bit lines, where F is a minimum feature size. The word line wiring is achieved on a 0.5F pitch by using sidewall spacer defined conductors that are oriented vertically widthwise within the trench. Thus, each memory cell of the memory array has a surface area that is approximately 4 F² while maintaining a folded bit line architecture. The memory cell structure provided by the invention results in a high density semiconductor memory array having an improved topography and which achieves the low noise benefits of a folded bit line architecture.

Further in accordance with the invention, there is provided a method for producing a memory array including a plurality of memory cells on a semiconductor substrate. The method includes the steps of providing a semiconductor substrate and forming a plurality of layers of semiconducting material on a surface of the substrate, including a first layer of a material of a first conductivity type formed on the substrate, a second layer of a material of a second conductivity type formed on the first layer, and a third layer of a material of the first conductivity type formed on the second layer. Then, a plurality of first trenches are formed in the layers of semiconducting material to form a plurality of bars having the first, second and third layers of semiconducting material, with the first layer of semiconducting material of each of the bars functioning as a bit line for the memory array. A plurality of second trenches are formed in the stack of layers of semiconducting material in a direction that is orthogonal to the direction of the bit lines to define a plurality of in-line access transistors on each of the bit lines, with each of the access transistors having a vertical channel region, defined by the second layer of material, exposed in a sidewall of one of the second trenches. A gate oxide is formed on a sidewall of the trench, overlying the channel regions of each of the access transistors. Then, first and second word lines are formed in each of the second trenches, with the first word line extending in the proximity of the channel regions of the access transistors on first alternate ones of the bit lines; and with the second word line extending in the proximity of the channel regions of the access transistors on second alternate ones of the bit lines. Then, the second trenches are filled with a dielectric material to bury the first and second word lines in the dielectric material in the second trenches. The method can be carried out using either bulk silicon or silicon on insulator processing techniques.

DESCRIPTION OF THE PREFERRED EMBODIMENTS

In the following detailed description of the preferred embodiments, reference is made to the accompanying drawings which form a part hereof, and in which is shown, by way of illustration, specific preferred embodiments in which the invention may be practiced. The preferred embodiments are described in sufficient detail to enable those skilled in the art to practice the invention, and it is to be understood that other embodiments may be utilized and that changes may be made without departing from the spirit and scope of the present invention. The terms wafer and substrate used in the following description include any semiconductor-based structure having an exposed silicon surface in which to form the integrated circuit structure of the invention. Wafer and substrate are used interchangeably to refer to semiconductor structures during processing. Both are to be understood as including doped and undoped semiconductors, epitaxial layers of a silicon supported by a base semiconductor, as well as other semiconductor structures well known to one skilled in the art. The following detailed description is, therefore, not to be taken in a limiting sense, and the scope of the present invention is defined only by the appended claims.

Figure 1:
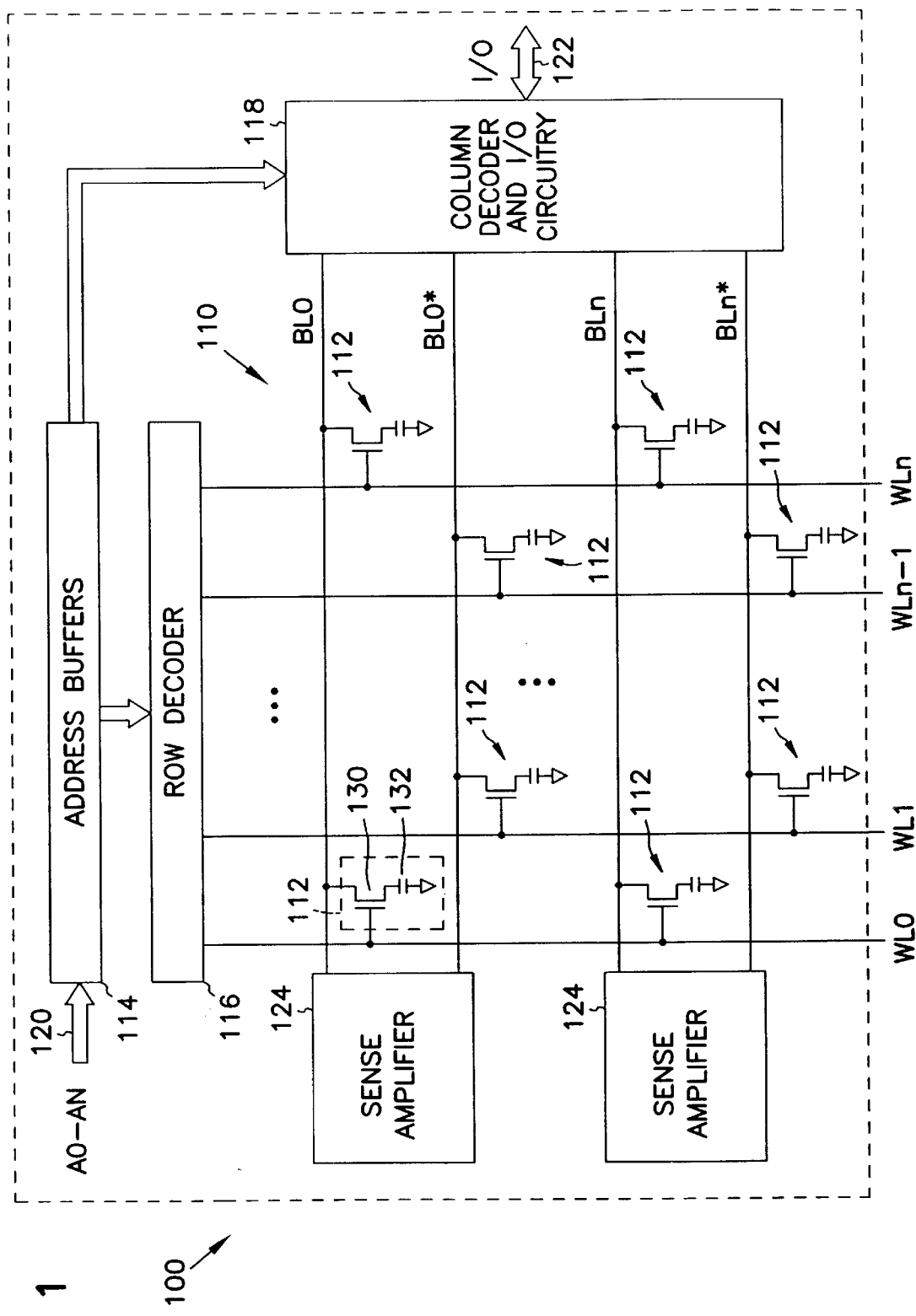
FIG. 1 is a representation of a semiconductor memory device including a matrix of the memory cells provided by the invention.

FIG. 1 is a representation of a semiconductor memory device 100 incorporating the memory cells provided by the invention. In the exemplary embodiment, the semiconductor memory device 100 is a dynamic random access memory (DRAM). However, the invention can be applied to other semiconductor memory devices, such as static random access memory devices, synchronous random access memory devices or other types of memory devices that include a matrix of memory cells that are selected or addressed by selectively activation of row and column conductors. The basic memory device 100 is well known in the art to include a memory array 110 constructed of rows and columns of memory cells 112 having inputs and outputs corresponding to rows and columns. In the example, the array 110 has N rows and N columns with complementary, paired bit lines BL0, BL0* . . . BLn, BLn*, and word (address) lines WL0, WL1 . . . WLn.

The bit line pairs BL0, BL0* . . . BLn, BLn* are used to write information into the memory cells 112 and to read data from the memory cells. The word lines WL0–WLn are used to address or select the memory cell to which data is to be written or read. Address buffer circuits 114 control row decoders 116, and column decoders of column decoder and input/output circuitry 118 to access the memory cells 112 of the memory array 110 in response to address signals A0–AN that are provided on address lines 120 during write and read operations. Sense amplifiers 124 are connected to each bit line pair. Data provided on data input/outputs 122 is written into the memory, and data read from the memory is applied to the data input/outputs 122. The address signals are provided by an external controller (not shown), such as a standard microprocessor. All of the memory cells 112 of the memory array 110 are identical, and accordingly, only one memory cell is described herein.

Each memory cell 112 includes an n-channel field-effect transistor 130 and a storage capacitor 132. The n-channel transistor 130 has a source-to-drain circuit connected to a bit line BL, which represents any one of the bit lines BL0, BL1 . . . BLn, BLn, shown in FIG. 1, and a gate electrode connected to a word line WL, which represents any one of the word lines WL0–WLn shown in FIG. 1.

Briefly, in operation, memory device 100 receives an address of a selected memory cell at address buffers 114. Address buffers 114 identify one of the word lines WL0–WLn of a selected memory cell to the row decoder 116. The row decoder 116 activates the selected word line to activate the access transistors 130 of each cells connected to the selected word line. The column decoders of column decoder and input/output circuitry 118 select the particular memory cell indicated by the address. For write operations, data provided on the data input/outputs 122 causes the storage capacitor 132 of the selected cell to be charged, or to be maintained discharged, to represent the data. For a read operation, the data stored in the selected cell, as represented by the charge state of the storage capacitor for the selected cell, is transferred to the data input/outputs 122.

Figure 2:
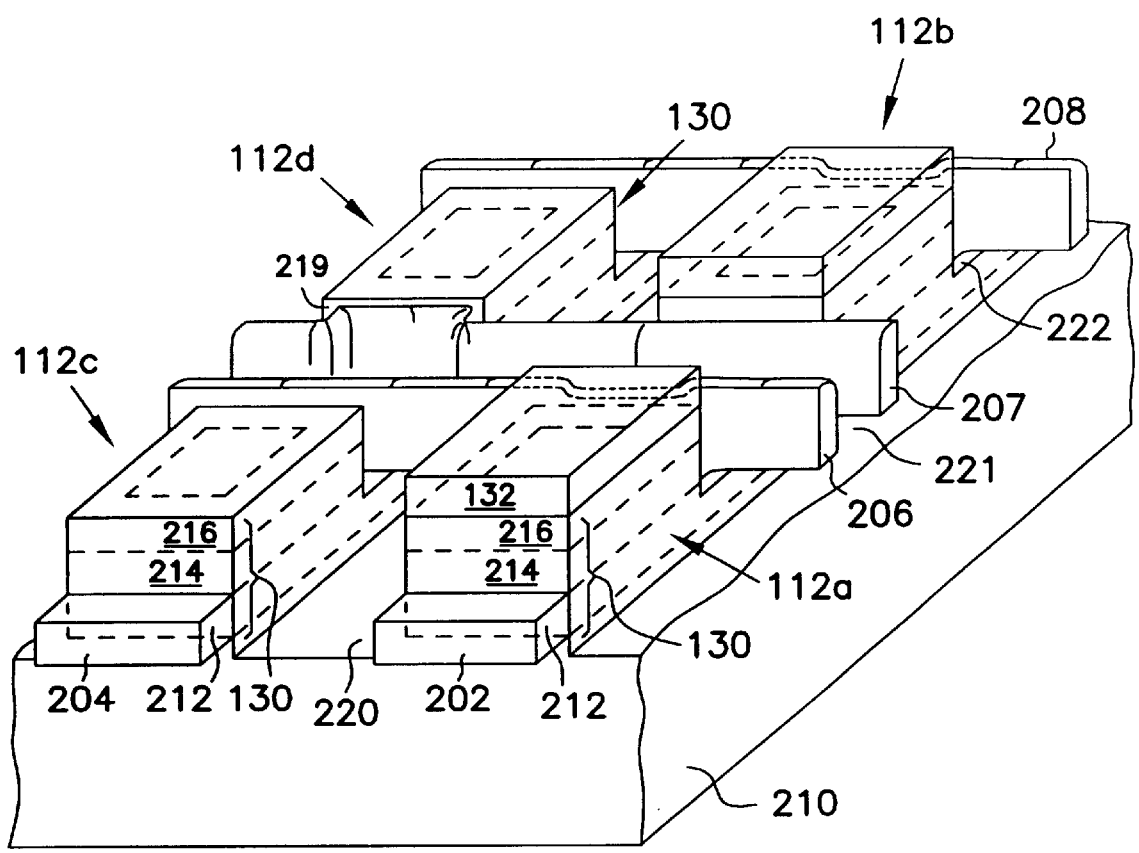
FIG. 2 is a perspective view of a portion of a semiconductor memory device provided by the invention and produced using a bulk silicon processing technique, and illustrating a plurality of the memory cells of the memory device.
Figure 3:
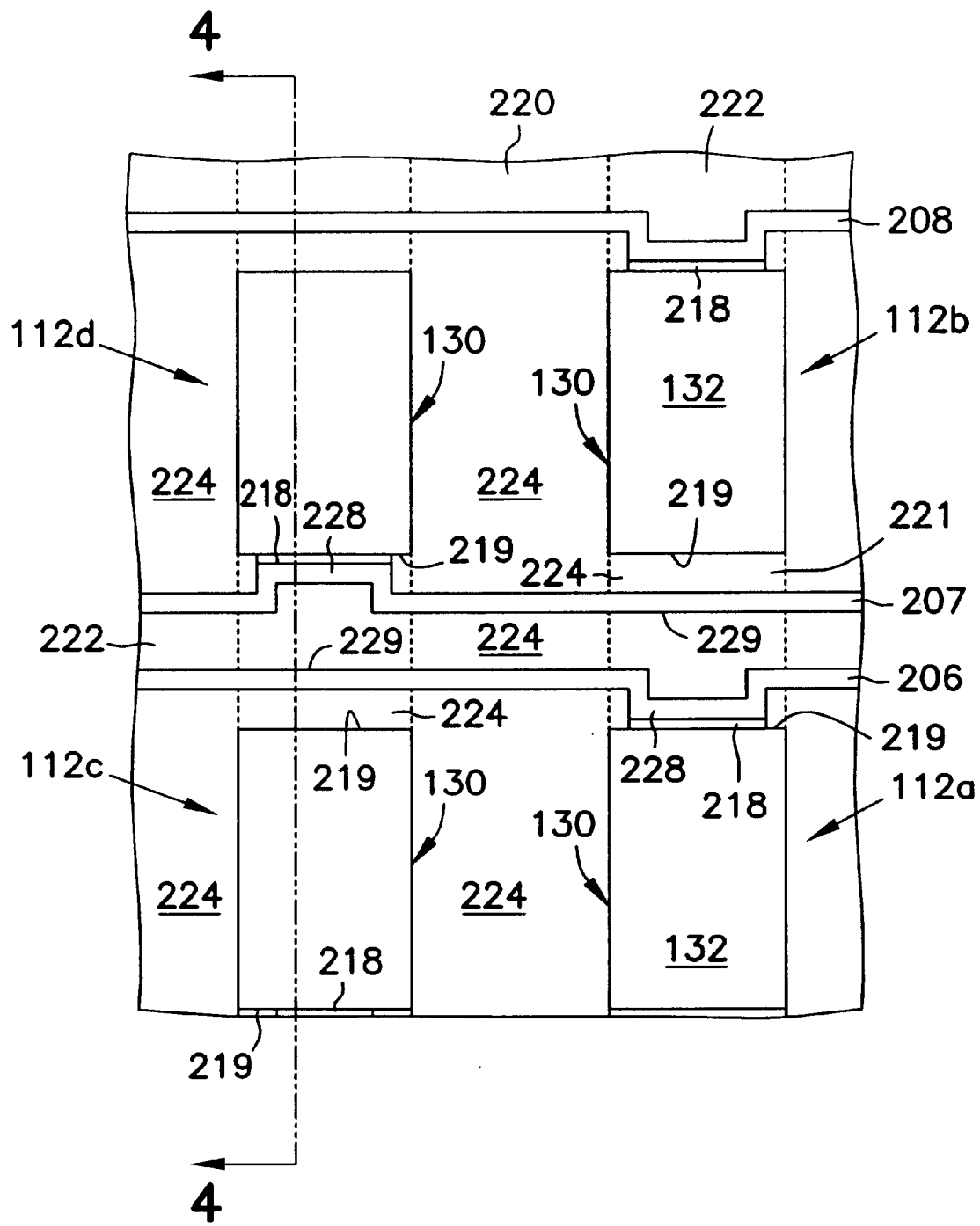
FIG. 3 is a plan view of the memory device portion of FIG. 2.

FIG. 2 is a perspective view of a portion of a DRAM device provided in accordance with one embodiment of the invention, and illustrates two memory cells, indicated by reference numerals 112a and 112b, and the transistors 130 for two other memory cells, indicated by reference numerals 112c and 112d, along with segments of a bitline pair 202, 204, which can be any one of the bitline pairs BL0, BL0* . . . BLn, BLn* and segments of word lines 206, 207 and 208, which can be any of the word lines WL0–WLn. FIG. 3 is a plan view of the portion of the memory device shown in FIG. 2, and FIG. 4 is a vertical section view taken along the line 44 of FIG. 3.

Figure 4:
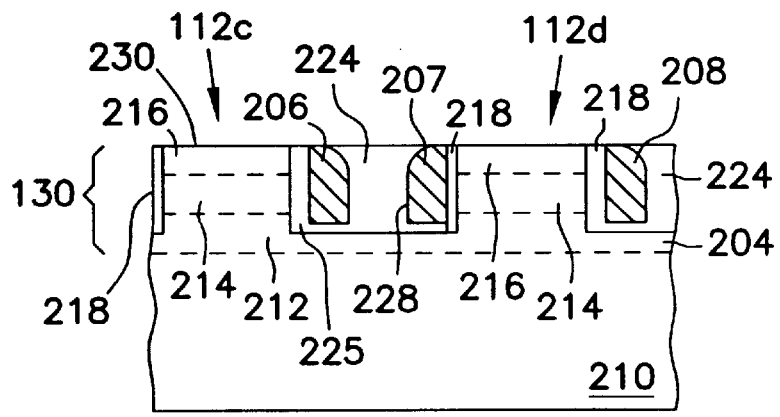
FIG. 4 is a section view taken along the line 4—4 of FIG. 3.

Referring additionally to FIGS. 3 and 4, in this embodiment, the memory device is fabricated on a substrate 210 using bulk silicon processing techniques. The transistor 130 of each memory cell is formed as a vertical device including a layer of n+ material 212 formed on substrate 210, a layer of p– material 214 formed on the layer of n-type material 212, and a further layer of n+ material 216 formed on the layer of p– material 214. The n+ layer 212 forms one of the source/drain regions of the transistor 130 and functions as the bit line for the memory cell. The n+ layer 216 forms the other one of the source/drain regions of the transistor 130. The p– layer 214 of the vertically oriented transistor 130 functions as the body portion of the transistor and defines the channel portion of the transistor 130. A gate oxide layer 218, which is formed on the sidewall of transistor structure, overlies the channel portion of the transistor 130 on one side of the transistor 130.

The active devices or transistors 130 of the memory cells are isolated from one another by isolation trenches 220, 221 and 222 that are filled with a dielectric material, such as silicon dioxide 224 (not shown in FIG. 2). The trenches 220 extend in the bit line direction for isolating the transistors 130 of the memory cells on adjacent bit lines, such as the transistors 130 of memory cells 112a and 112c, and the transistors 130 of memory cells 112b and 112d. The trench 221 extends orthogonal to the trench 220, and to the bit lines 202 and 204, defining the transistors 130 of in-line pairs of the memory cells, such as transistors 130 of the memory cell pair 112a and 112b, and transistors 130 of the memory cell pair 112c and 112d. Similarly, trench 222 defines the transistors of in-line memory cells 112b and 112d and the transistors of further memory cells (not shown). The gate oxide 218 is grown on a sidewall 219 of the trench 221 at which one side of the transistor structure is exposed during fabrication of the memory cell. The body portion 214 of each of the semiconductor devices that forms one of the transistors of the memory cells is floating and is fully depleted.

In accordance with one aspect of the invention, the cell transistors 130 for the memory cells 112 are formed on the bit line. Each of the bit lines, such as bit lines 202 and 204, consists of a single crystal silicon bar upon which a row of separate memory cells is formed. As illustrated in FIG. 2, memory cells 112a and 112b are formed on a portion of bit line 202, and memory cells 112c and 112d are formed on a portion of bit line 204. In this embodiment, the bit lines are fabricated to be in contact with the silicon substrate 210 as is shown in FIGS. 2 and 4, for example.

The word lines, such as word lines 206 and 207, which gate the transistors 130, are located in the isolation channel or trench 221 between memory cells, spaced apart from one another by the dielectric material 224, such as $SiO_2$. The word lines are oriented vertically widthwise in the trench. The word lines can be formed of an n+ polysilicon or a suitable metal. Two word lines, such as word lines 206 and 207, are formed within a single trench 221 that extends between the memory cells 112a–112d. As shown in FIG. 3, for memory cells 112a and 112b, for example, both an active word line, defined by word line portion 228 of word line 206, and a passing word line, defined by passing word line portion 229 of word line 207, can be contained within each cell to provide folded bit line architecture. Each word line gates the transistors of alternate in-line memory devices. For example, the word line 206 is positioned to be spaced apart from the vertical sidewall 219 of the transistor 130 of memory cell 112c by a layer 225 of $SiO_2$ that is formed together with layer 224 of $SiO_2$. Word line 206 includes a jog that defines active word line portion 228 adjacent to the transistor 130 of memory cell 112a that the word line 206 gates, so that the word line 206 contacts the gate oxide 218 formed on the sidewall 219. The other word line 207 that is located within the trench 221 is spaced apart from the transistor 130 of memory cell 112b by oxide 224 and includes a jog 228 so that the word line 207 engages the gate oxide 218 of the transistor 130 of the memory cell 112d that the word line 207 gates.

Thus, word line 206 gates the access transistor 130 of memory cell 112a and is isolated by dielectric material 224 from the access transistor 130 of memory cell 112c. Word line 207 is isolated from the access transistor 130 of memory cell 112b and gates the access transistor 130 of memory cell 112d. The access transistor of memory cell 112b is gated by word line 208 which is isolated from the access transistor of memory cell 112d, and the access transistor of memory cell 112c is gated by a further word line (not shown) that extends in a trench along the opposite sidewall of the transistor.

The width of the cell transistor 130 corresponds to the width of the bit line, or one feature size "F" and the length to the cell transistor is approximately "F". As has been stated, the word lines are oriented vertically widthwise, with both active and passing word lines contained in each memory cell to provide a folded bit line architecture. The surface area of each memory cell is approximately "$4F^2$", while preserving the folded bit line architecture. Word line wiring is achieved on a half "F" (0.5F) pitch by using the sidewall spaced defined conductors which gate alternate cell devices.

In accordance with one aspect of the invention, all of the bit lines BL0, BL0* ... BLn, BLn* and all of the word lines WL0 ... WLn are fabricated to be located beneath the surface of the silicon. As is illustrated in FIG. 4, the bit line pair 202, 204 and the word lines 206, 207 and 208 are located beneath the active silicon surface 230. This frees up space on the upper portion of the memory device for formation of the capacitor of the memory cell on the upper portion of the memory cell, thus maximizing the possible storage area that is available for a given cell area. Contacts to the bit lines and to the word lines can be made outside of the memory array by using conventional methods of contact hole etching and stud formation.

A stacked capacitor, such as the capacitors 132 illustrated for memory devices 112a and 112b, is formed on the top of the vertical device pillar using any of the many capacitor structures and process sequences known in the art.

Process

One process for fabricating the memory cells 112 is described with reference to FIGS. 5A–5M. In this process, the memory cells 112 are produced using bulk silicon processing techniques. The dimensions are appropriate to a 0.2 $\mu$m CD technology and can be scaled accordingly for other CD sizes. In the following description, certain of the elements that correspond to elements of the memory cells 112 of FIGS. 2–4 have been given the same reference numerals in FIGS. 5A–5M.

Figure 5A:
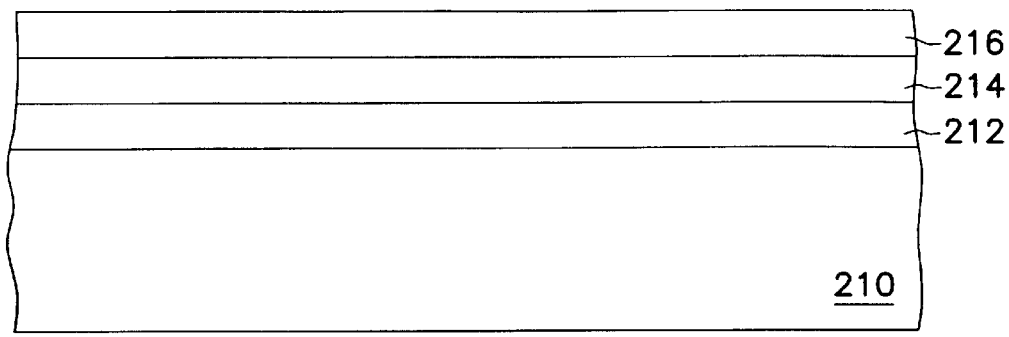
FIGS. 5A–5M illustrate steps in the process of forming the semiconductor memory device in accordance with the invention.

Referring first to FIG. 5A, starting with p-type silicon substrate wafer 210, a layer 212 of n+ material is formed on the substrate 210 by ion implantation or epitaxial growth. The thickness of the layer 212 is that of the desired bit line thickness which is typically in the range of 0.2 to 0.5 $\mu$m. An epitaxial layer 214 of p– silicon is grown to contain the device channel. The thickness of the layer 214 of p– material can be in the order of 0.4 $\mu$m. Then, the upper layer 216 of n+ material is formed by implantation or epitaxial growth.

Figure 5B:
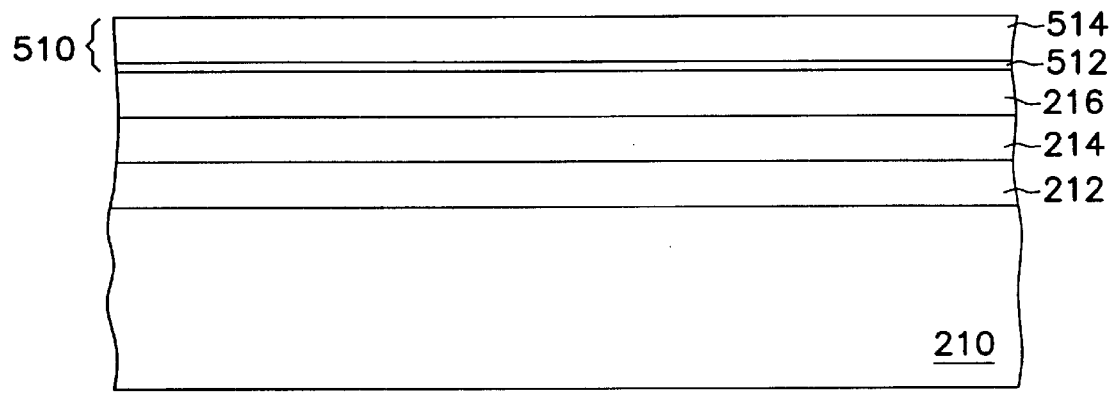

Referring to FIG. 5B, next, a pad layer 510 is formed by depositing a thin layer 512 of $SiO_2$ on the upper layer 216 n+ material. The $SiO_2$ layer 512 can be 10 nm in thickness. A layer 514 of silicon nitride $Si_3N_4$ is deposited on the $SiO_2$ layer 512 using techniques well known in the art, such as chemical vapor deposition (CVD). The thickness of the layer 514 of $Si_3N_4$ can be 100 nm.

Figure 5C:
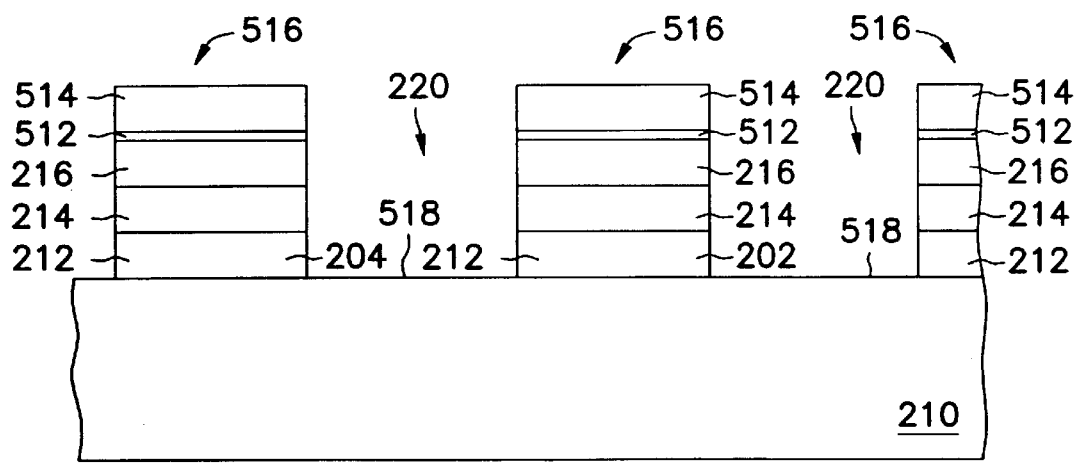

Then, photo resist is applied and masked to expose rows or bars 516 containing the stacked layers of n+ material 212, p– material 214 and n+ material 216, with the bars 516 being oriented in the bit line direction. The pad 510 and the silicon are directionally etched to form the trenches 220 as shown in FIG. 5C. By way of example, the exposed pad and silicon regions can be etched away with a directional etchant, preferably a reactive ion etch (RIE), to form trenches in the substrate. Then, the photo resist is removed. The depth of the etch into the silicon is sufficient to reach the surface 518 of the substrate 210, forming the structure shown in FIG. 5C. The silicon bars can have a width of one micron or less and preferably corresponds to the minimum feature size F. The trench width can be approximately equal to the width of the silicon bars. Then, $SiO_2$ material 224 is deposited to fill the trenches 220, providing the structure shown in FIG. 5D. The surface is planarized using a conventional planarization method, such as chemical mechanical polishing (CMP).

Figure 5D:
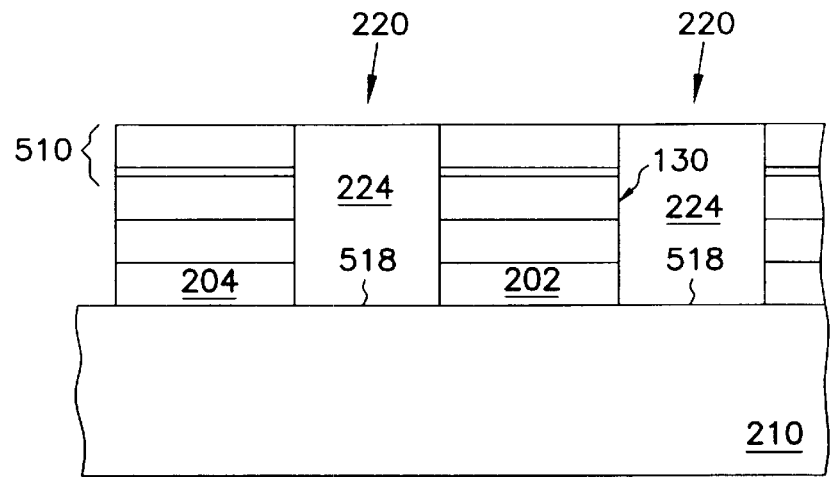
Figure 5E:
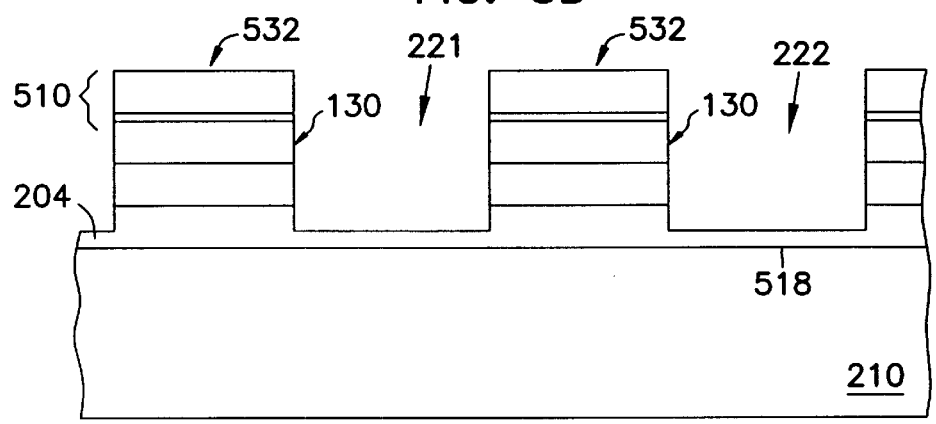
Figure 5F:
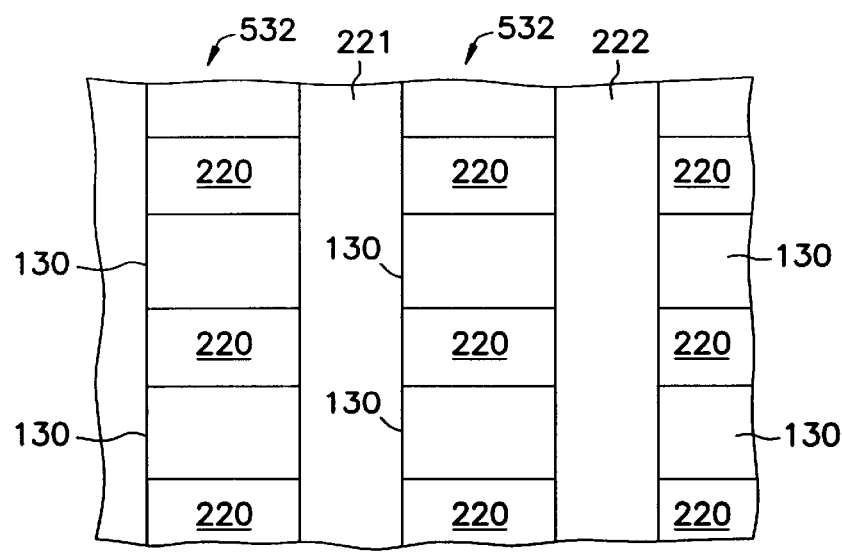

Referring now to FIGS. 5E and 5F, which are views of the semiconductor structure rotated clockwise ninety degrees relative to FIG. 5D, then, a photo resist material is applied and masked to expose bars 532, that are formed using a directional etch, preferably RIE, in a direction that is orthogonal to the bit line direction and which define the transistors 130. The adjacent access transistors in each of the rows, i.e., the transistors on adjacent bit lines, being separated from one another by the oxide filled trenches 220. The orthogonal relationship between the oxide filled trenches 220 and trenches 221, 222 is shown in FIG. 5F, for example, which is a plan view of the portion of the memory device. The exposed $SiO_2$ and silicon are etched into the bar 204, that functions as the bit line, to a depth of about 100 nm as is shown in FIG. 5E, forming a plurality of pillars 538, shown in FIG. 5G, each of the pillars including stacked layers of n+ material 212, p− material 214, and n+ material 216 that define the access transistor 130 for one of the memory cells 112.

Figure 5G:
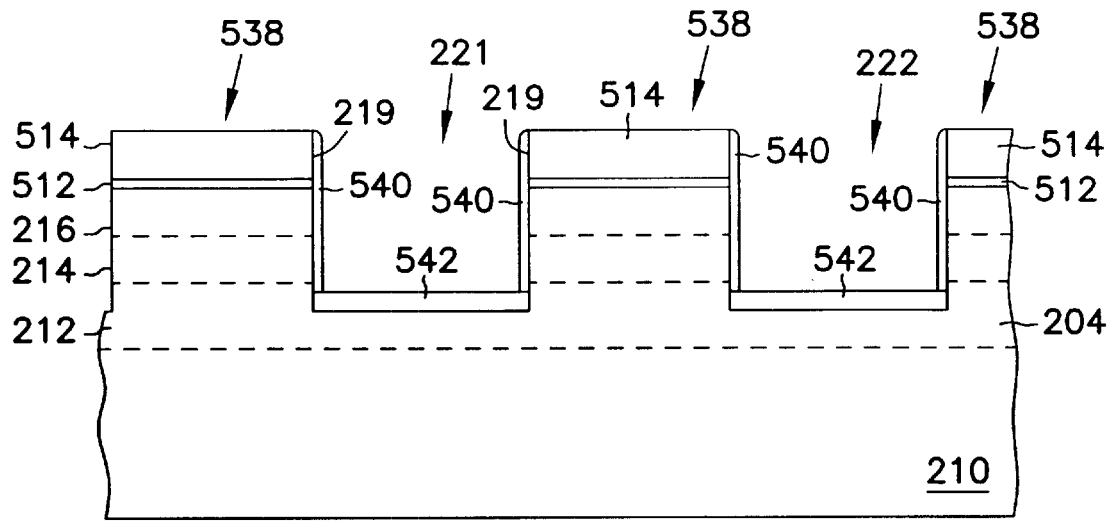

Referring now to FIG. 5G, then, a conformal layer 540 of silicon nitride $Si_3N_4$ is deposited and directionally etched to leave the $Si_3N_4$ only on the sidewalls 219 of the pillars 538 that define the transistors 130. The thickness of the layer 540 of $Si_3N_4$ is about 20 nm. Then, a layer 542 of thermal oxide $SiO_2$ is grown on the base of the trenches 221 and 222 to insulate the exposed bit line bars. The thickness of the layer of $SiO_2$ is about 100 nm. After the layer of $SiO_2$ has been grown, the thin layer of $Si_3N_4$ is stripped.

Figure 5H:
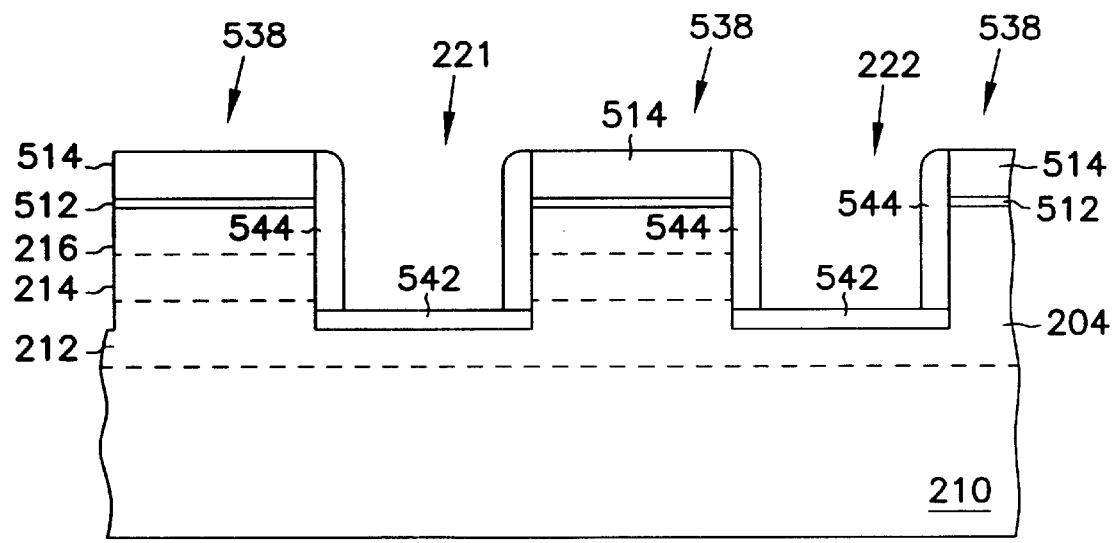
Figure 5I:
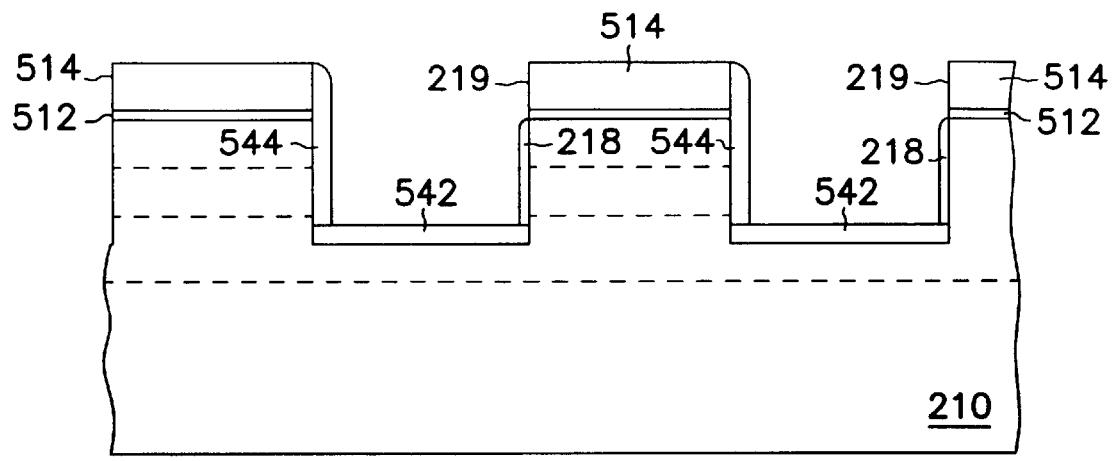
Figure 5J:
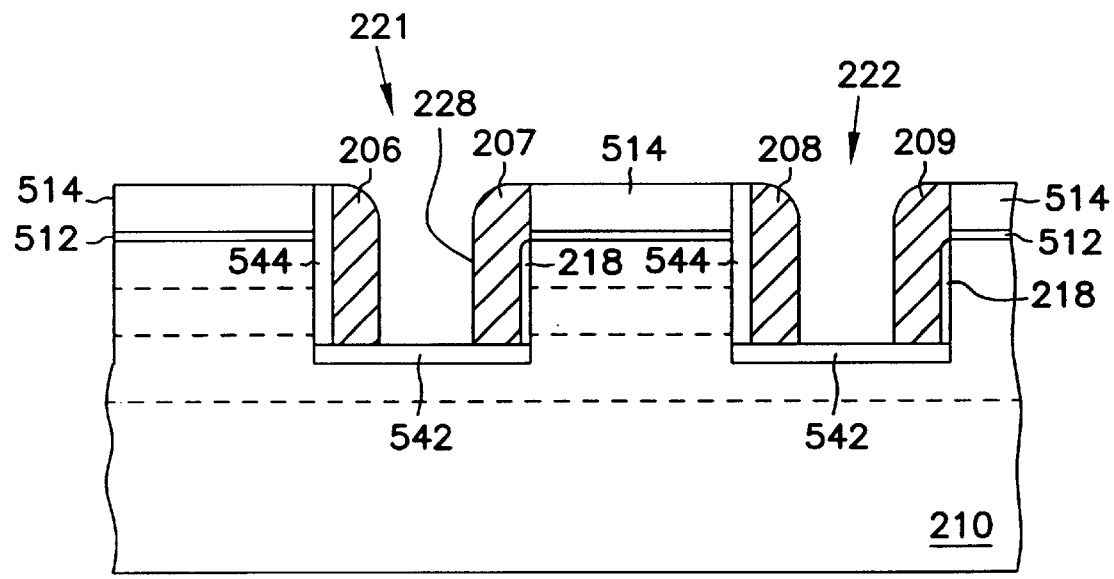

Then, intrinsic polysilicon is deposited using CVD to a thickness of about 50 nm, providing the structure shown in FIG. 5H. The layer 544 of polysilicon is etched directionally to leave polysilicon on only the vertical sidewalls of the pillars 538. Then, photo resist is applied and masked to expose the sidewall 219 of each pillar on which the device channels are to be formed, and a gate oxide 218 is grown on the exposed sidewall of the pillar, providing the structure shown in FIG. 5I. Although not shown in FIG. 5I, the gate oxide also is grown on the remaining intrinsic polysilicon.

An n+ polysilicon or other suitable conductor is CVD deposited to a thickness of approximately 60 nm, to form the word line conductors 206, 207, 208 and 209. The polysilicon is directionally etched, forming the pattern shown in FIG. 3, leaving the polysilicon that forms the active portion 228 (FIG. 3) of the word line conductor 207 only on the gate oxide 218 that overlies the vertical sidewall of the access transistor for memory cell 112d, and active portion 228 of word line conductor 208, exposed in the trenches 221 and 222, and leaving the polysilicon that forms the passive portions 229 (FIG. 3) of the word line conductors 206 and 207 only on the intrinsic polysilicon 544, providing the structure shown in FIG. 5J.

Figure 5K:
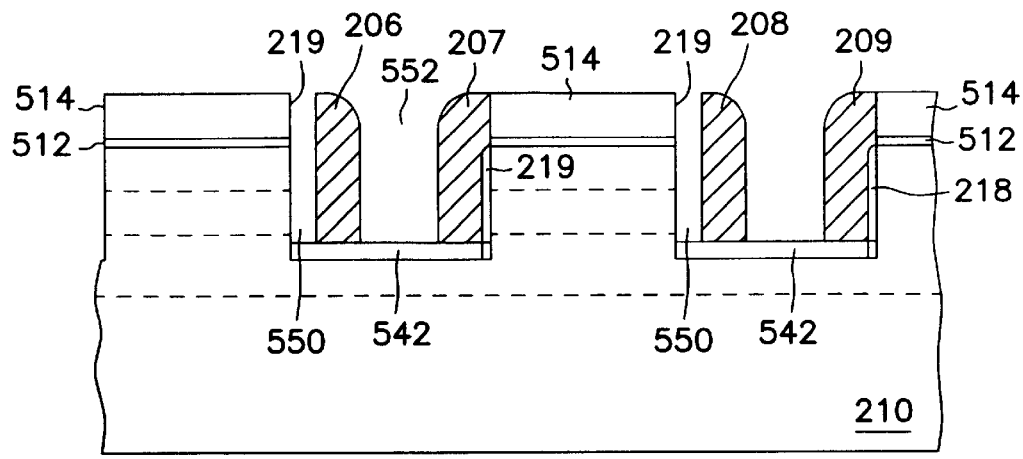

A brief oxide etch is performed to expose the top portion of the intrinsic polysilicon. Then, an isotropic etch is carried out to remove all of the remaining intrinsic polysilicon, forming a cavity 550 between each word line and the sidewall that is adjacent to the word line as is shown in FIG. 5K. The word lines, such as word lines 206 and 207 that extend within trench 221, are spaced apart from one another forming a gap 552 therebetween. Then an anisotropic etch is carried out to recess the top of the word lines, such as word lines 206 and 207, to below the approximate level of the silicon surface, which is defined by the interface between layer 512 of $SiO_2$ and the upper layer 216 n+ silicon material.

Figure 5L:
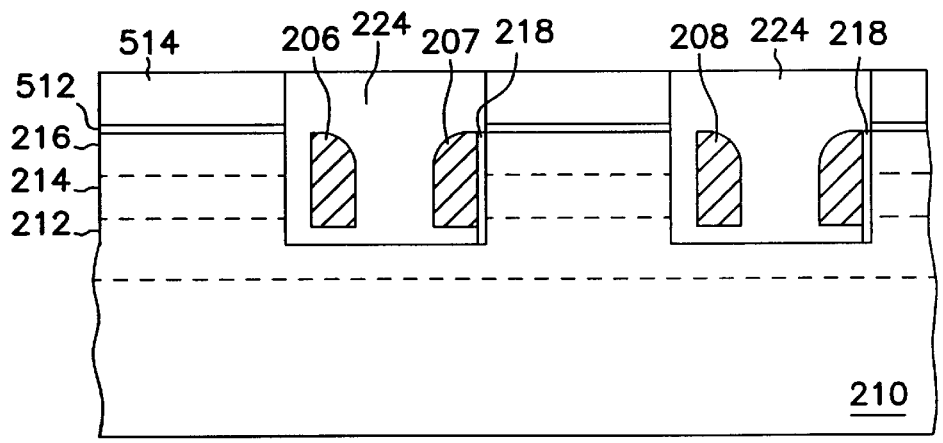
Figure 5M:
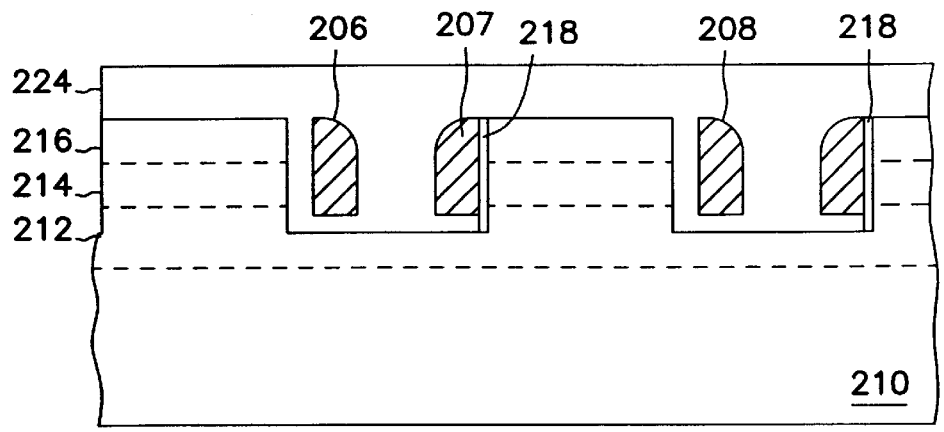

Then, a dielectric material such as $SiO_2$, indicated by reference numeral 224, is CVD deposited to fill in the cavities 550 that are created as the result of removal of the intrinsic polysilicon and to fill the spaces 552 between the word line conductors, providing the structure shown in FIG. 5L. The surface is planarized down to the $Si_3N_4$ layer 514 using CMP or any other suitable planarization process. The remaining $Si_3N_4$ layer 514 is removed using an etching process. A layer 224 of $SiO_2$ is CVD deposited to cover the active surface of the substrate, providing the structure shown in FIG. 5M.

The structure thus formed is then processed using known techniques to fabricate a storage capacitor on the upper surface of the structure, followed by conventional back end of line (BEOL) procedures.

Alternate Embodiment

Figure 6:
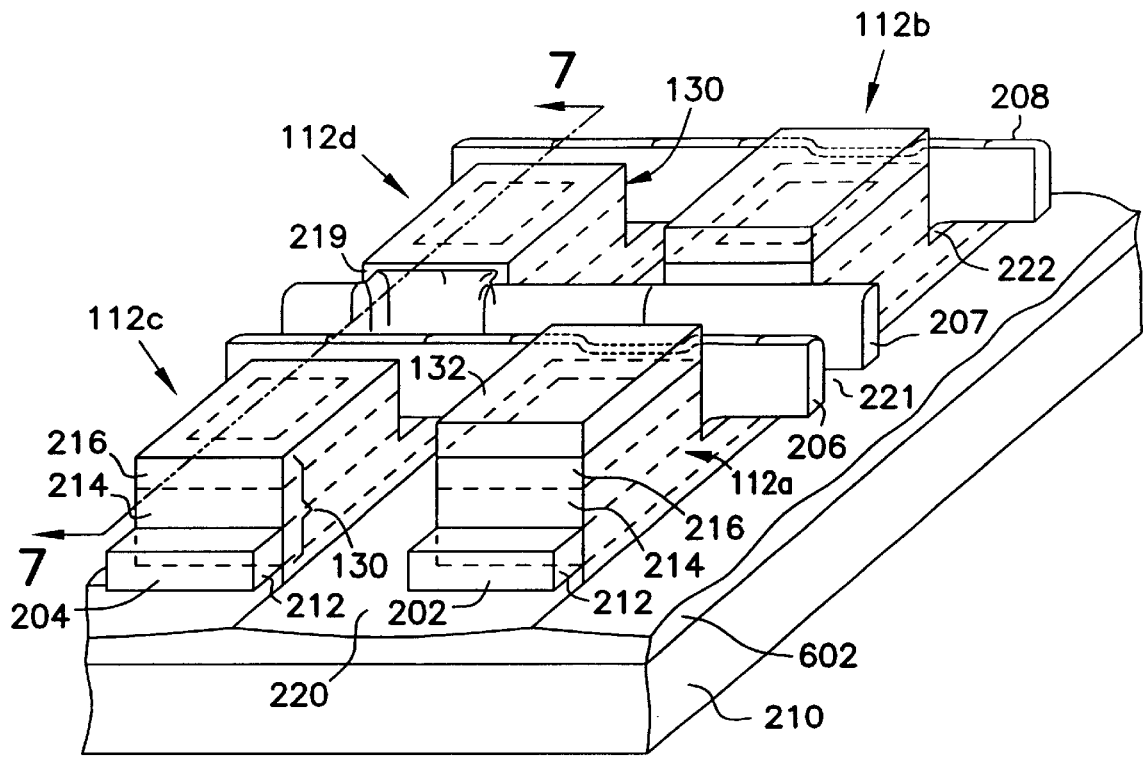
FIG. 6 is a perspective view of a portion of a semiconductor memory device provided by the invention and which is produced using a silicon on insulator process, and illustrating a plurality of the memory cells of the memory device.
Figure 7:
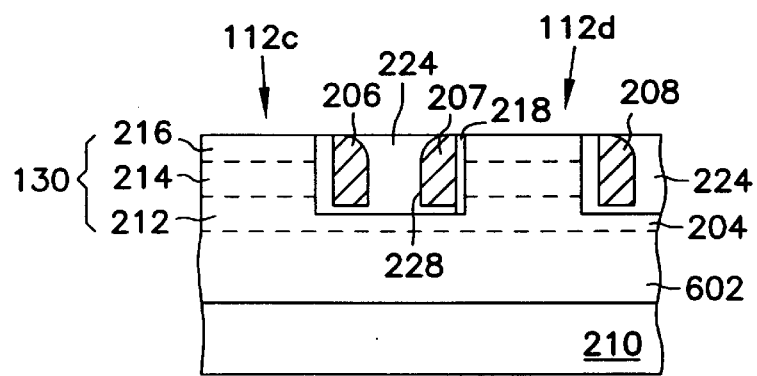
FIG. 7 is a vertical section view taken along the line 7—7 of FIG. 6.

Referring to FIGS. 6 and 7, there is shown a portion of a DRAM device provided in accordance with a second embodiment of the invention. The DRAM device includes memory cells 112a–112d that are similar to those for DRAM device shown in FIGS. 2–4. Accordingly, elements of the memory cells of the DRAM device shown in FIG. 6 have been given the same reference number as like elements of the memory cells of DRAM device shown in FIG. 2. In the embodiment shown in FIGS. 6 and 7, the memory cells are fabricated using a silicon on insulator (SOI) process. This provides a layer 602 of silicon dioxide $SiO_2$ that isolates the bit lines, such as the bit lines 202 and 204, and the transistors 130 formed thereon, from the substrate 210.

The process for fabricating the memory cells for the DRAM device is similar to that described above with reference to FIGS. 5A–5M for fabricating the memory cells for the DRAM device shown in FIGS. 2–4, except for the formation of the isolation layer 602 between the substrate and the active devices of the memory cells. By way of example, the isolation layer between the substrate and the active devices of the memory cells can be produced using the procedure described in the U.S. patent application Ser. No. 08/706,230 of Leonard Forbes, which is entitled "Technique For Producing Small Islands of Silicon On Insulator" and which is assigned to Micron Technology, Inc. This patent application is incorporated herein by reference.

Figure 8A:
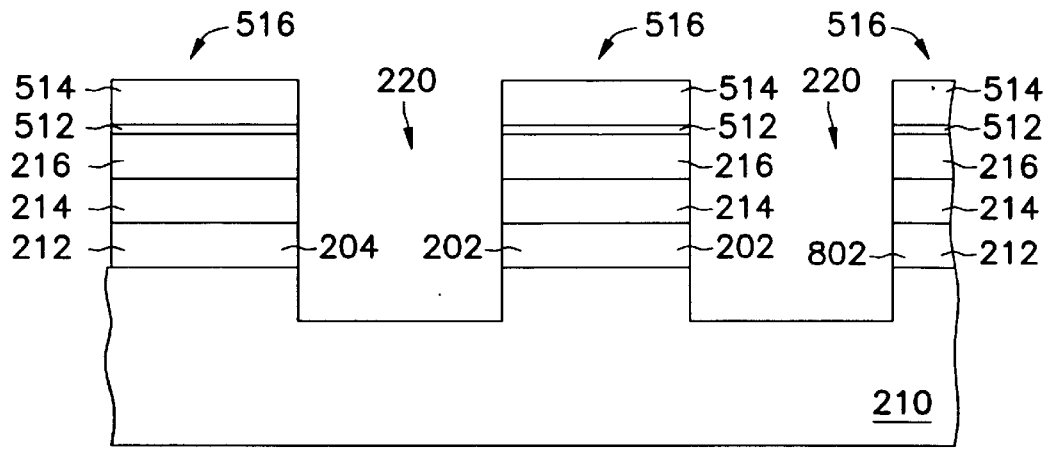
FIGS. 8A–8C illustrate steps relating to a silicon on insulator process used in fabricating the semiconductor memory device of FIG. 6.

First the layers of n material 212, p− material 214 and n material 216 are formed on the substrate 210, as described above with reference to FIGS. 5A–5C, and the trenches 220 are formed, defining the silicon bars 516 on which the transistors 130 are defined in subsequent process steps. In this embodiment, which uses silicon on insulator techniques, the depth of the etch is to the full SOI depth, which is below the surface 802 of the substrate and which is greater than or approximately equal to 0.6 um, providing the structure shown in FIG. 8A.

Figure 8B:
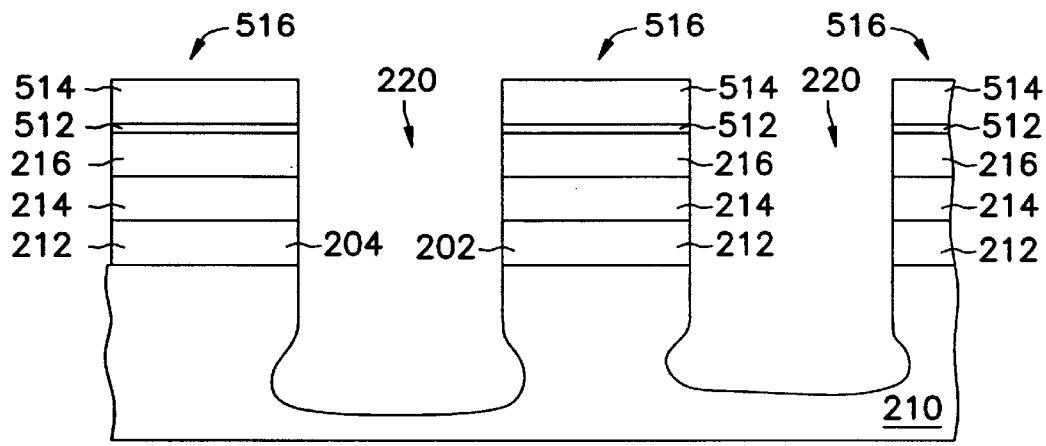

Then, an isotropic chemical etch is used to partially undercut the bars 516 of silicon, as shown in FIG. 8B. A standard chemical etch using hydrofluoric acid (HF) or a commercial etchant sold under the trade name CP4 (a mixture of approximately 1 part (46% HF):1 part ($CH_3COOH$):3 parts ($HNO_3$)) is used for the isotropic etchant. It is important to use an isotropic etch for this step to compensate for the volume of oxide to be formed in the next step. In general, the volume of oxide formed is approximately twice that of the silicon 210 consumed.

Figure 8C:
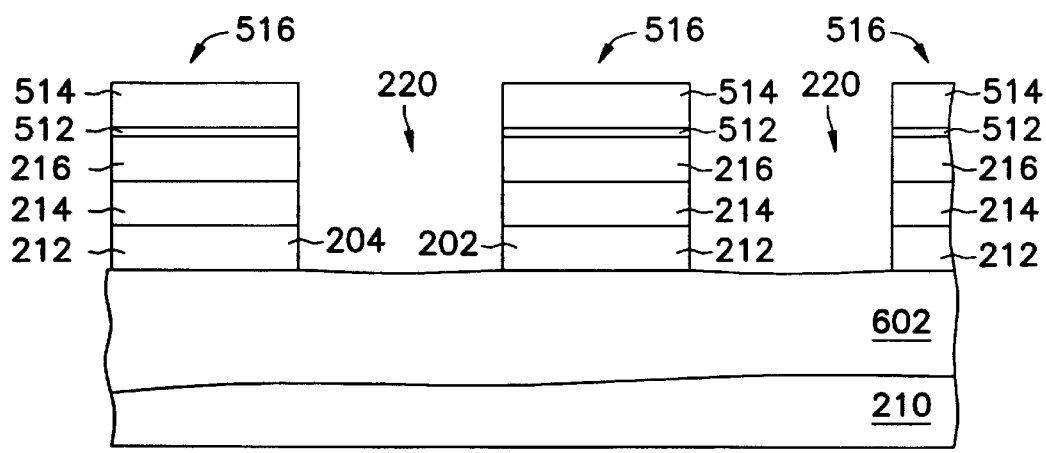

The substrate 210 is then oxidized using a standard silicon processing furnace at a temperature of approximately 900 to 1,100 degrees Celsius, providing the structure shown in FIG. 8C which includes an oxide layer 602 isolating the bit lines and the active devices formed on the bit lines from the substrate 210. A wet, oxidizing ambient is used in the furnace chamber to oxidize the exposed silicon regions on the lower part of the trenches in a parallel direction to the surface of the substrate 210. The substrate 210 is oxidized for a time period, such that oxide fully undercuts the bottom of the silicon rows, leaving isolated silicon rows. By using narrow, sub-micron rows of silicon and appropriately designed process conditions, generally planar structures are formed. The larger volume of oxide fills the trenches between the rows. This avoids the need for complex and expensive planarization techniques, such as employed in older micron dimension technologies. The time period for oxidation depends on the width of the rows and the effective width after the undercut step. As the desired size of the silicon rows decreases, so does the required oxidation time. For example, for sub-0.25 micron technology, oxidation time is approximately 1 hour.

Undercutting the silicon rows, reduces the effective width of the rows to a distance small enough that a relatively short, simple oxidation can fully undercut the silicon rows. Filly undercutting the rows of silicon is possible because the width of the rows is one micron or less.

The process then continues with the steps described above with reference to FIGS. 5D–5M, to fill the trenches 220 with oxide 224, to produce the trenches 221 and 222, and to form the word line conductors 206–209 in the trenches 221 and 222, providing the structure shown in FIGS. 6–7.

Thus, it has been shown that the invention provides a memory cell structure for a DRAM memory device. The memory cell structure includes a vertical transistor fabricated on the bit line for the memory cell. In addition, the word line conductors are buried in the oxide contained in an isolation trench that extends between the access transistors for the memory cell. Forming the access transistors on the bit lines of the memory array, with the feature size of the access transistors defined by the bit lines, and with the vertical orientation and 0.5F pitch of the word lines of the memory array, allows the surface area of each of the memory cells to be approximately $4F^2$. In one embodiment, each isolation trench contains both an active word line and a passing word line to provide folded bit line architecture for the memory array. Each word line gates the transistors of alternate in-line memory devices. The memory cell structure can be formed using a bulk silicon process or by using silicon on insulator techniques.

What is claimed is:

1. A semiconductor memory cell structure fabricated on a substrate of a semiconductor material, the memory cell comprising:
   a bit line on the substrate;
   a single access transistor fabricated as a vertical structure on a portion of the bit line, the access transistor having a first source/drain region defined by said bit line portion, a second source/drain region, and a vertical channel region located in a generally vertical sidewall portion on only one side of the vertical structure of the access transistor, the access transistor having an upper surface defining an upper active silicon surface for the memory cell structure;
   a gate oxide formed on the sidewall portion of the access transistor overlying the channel region of the access transistor; and
   a word line extending along the sidewall portion of the access transistor, with a portion of the word line being formed on the gate oxide on only one side of the vertical structure, wherein the wordline has a side facing the vertical channel which has a vertical length of less than 60 nanometers; and
   a second word line electrically isolated from the access transistor extending along a. generally vertical sidewall portion of the access transistor opposite the vertical channel region, wherein the bit line and the word lines are located below the active silicon surface of the memory cell structure.

2. The memory cell structure according to claim 1, wherein the word line has a horizontal length which is greater than the vertical length of the side facing the vertical channel.

3. A semiconductor memory cell structure fabricated on a substrate of a semiconductor material, the memory cell comprising:
   a bit line on the substrate;
   a single access transistor fabricated as a vertical structure on a portion of the bit line, the access transistor having a first source/drain region defined by said bit line portion, a second source/drain region, and a vertical channel region located in a generally vertical sidewall portion on only one side of the vertical structure of the access transistor, the access transistor having an upper surface defining an upper active silicon surface for the memory cell structure;
   a gate oxide formed on the sidewall portion of the access transistor overlying the channel region of the access transistor;
   a word line extending along the sidewall portion of the access transistor, with a portion of the word line being formed on the gate oxide, wherein the word line is oriented horizontally along the sidewall portion of the access transistor;
   a second word line electrically isolated from the access transistor extending along a generally vertical sidewall portion of the access transistor opposite the vertical channel region, wherein the bit line and the word lines are located below the active silicon surface of the memory cell structure; and
   a layer of a dielectric material interposed between the bit line and the substrate for electrically isolating the bit line, and the access transistor fabricated on the bit line, from the substrate.

4. The semiconductor memory cell structure of claim 3, wherein the horizontally oriented word line has a vertical edge opposing the vertical channel, and wherein the vertical edge has a vertical height of less than 60 nanometers.

5. A semiconductor memory cell structure fabricated on a substrate of a semiconductor material, the memory cell comprising:
   a bit line on the substrate;
   a single access transistor fabricated as a vertical structure on a portion of the bit line, the access transistor having a first source/drain region defined by said bit line portion, a second source/drain region, and a vertical channel region located in a generally vertical sidewall portion on only one side of the vertical structure of the access transistor, the access transistor having an upper surface defining an upper active silicon surface for the memory cell structure;
   a gate oxide formed on the sidewall portion of the access transistor overlying the channel region of the access transistor;
   a word line extending along the sidewall portion of the access transistor, with a portion of the word line being formed on the gate oxide, wherein the wordline has a side with a vertical length of less than 60 nanometers facing the vertical channel;
   a second word line electrically isolated from the access transistor extending along a generally vertical sidewall portion of the access transistor opposite the vertical channel region, wherein the bit line and the word lines are located below the active silicon surface of the memory cell structure;
   wherein the word line is oriented horizontally along the sidewall portion of the access transistor; and
   wherein the surface area of the memory cell structure is approximately $4F^2$, where F is a minimum feature size of the memory cell structure.

6. The semiconductor memory cell structure of claim 5, wherein the word line has a horizontal length which is greater than the vertical length of the side facing the vertical channel.

7. A memory array fabricated on a semiconductor substrate, the memory array comprising:
  a plurality of bit lines on the substrate;
  a plurality of word lines;
  a plurality of memory cells, each of the memory cells including a single access transistor formed as a vertical structure having first and second source/drain regions and a channel region located in a generally vertical sidewall portion on only one side of the vertical structure of the access transistor, first and second ones of the access transistors each being formed on a first one of the bit lines, and third and fourth ones of the access transistors each being formed on a second one of the bit lines; and
  at least one isolation trench extending orthogonally to the first and second bit lines, the isolation trench including a dielectric material for providing isolation between the first and second access transistors and for providing isolation between the third and fourth access transistors;
  a first one of the word lines extending within the isolation trench in the proximity of the first and third access transistors, the first word line being electrically coupled to the channel region of the first access transistor, wherein the first word line has a side with a vertical length of less than 60 nanometers facing the channel region, and the first word line being electrically isolated from the channel region of the third access transistor;
  and a second one of the word lines extending within the isolation trench in parallel with the first word line being at approximately equal vertical position and spaced apart from the first word line, the second word line extending in the proximity of the second and fourth access transistors, the second word line being isolated from the channel region of the second access transistor and being electrically coupled to the channel region of the fourth access transistor, wherein the second word line has a side with a vertical length of less than 60 nanometers facing the channel region of the fourth access transistor, and the first and second word lines being buried within the dielectric material in the isolation trench and located below an active silicon surface of the memory cell.

8. The memory array of claim 7, wherein the first and second word lines have a horizontal length which is greater than the vertical length of the side facing the channel regions of the first and the fourth access transistors.

9. A memory array fabricated on a semiconductor substrate, the memory array comprising:
  a plurality of bit lines on the substrate;
  a plurality of word lines;
  a plurality of memory cells, each of the memory cells including an access transistor having first and second source/drain regions and a channel region, first and second ones of the access transistors each being formed on a first one of the bit lines, and third and fourth ones of the access transistors each being formed on a second one of the bit lines; and
  at least one isolation trench extending orthogonally to the first and second bit lines, the isolation trench including a dielectric material for providing isolation between the first and second access transistors and for providing isolation between the third and fourth access transistors;
  at first one of the word lines extending within the isolation trench in the proximity of the first and third access transistors, the first word line being electrically coupled to the channel region of the first access transistor, wherein the first word line has a side with a vertical length of less than 60 nanometers facing the channel region, and the first word line being electrically isolated from the channel region of the third access transistor;
  and a second one of the word lines extending within the isolation trench in parallel with the first word line and spaced apart from the first word line, the second word line extending in the proximity of the second and fourth access transistors, the second word line being isolated from the channel region of the second access transistor and being electrically coupled to the channel region of the fourth access transistor, wherein the second word line has a side with a vertical length of less than 60 nanometers facing the channel region of the fourth access transistor, and the first and second word lines being buried within the dielectric material in the isolation trench and located below an active silicon surface of the memory cell, including a second isolation trench extending orthogonally to the first-mentioned isolation trench, the second isolation trench containing a dielectric material for providing isolation between the first and second bit lines, and between the first and third access transistors, and between the second and fourth transistors.

10. A memory array fabricated on a semiconductor substrate, the memory array comprising:
  a plurality of bit lines on the substrate;
  a plurality of word lines;
  a plurality of memory cells, each of the memory cells including an access transistor having first and second source/drain regions and a channel region, first and second ones of the access transistors each being formed on a first one of the bit lines, and third and fourth ones of the access transistors each being formed on a second one of the bit lines; and
  at least one isolation trench extending orthogonally to the first and second bit lines, the isolation trench including a dielectric material for providing isolation between the first and second access transistors and for providing isolation between the third and fourth access transistors;
  at first one of the word lines extending within the isolation trench in the proximity of the first and third access transistors, the first word line being electrically coupled to the channel region of the first access transistor, wherein the first word line has a side with a vertical length of less than 60 nanometers facing the channel region, and the first word line being electrically isolated from the channel region of the third access transistor;
  and a second one of the word lines extending within the isolation trench in parallel with the first word line and spaced apart from the first word line, the second word line extending in the proximity of the second and fourth access transistors, the second word line being isolated from the channel region of the second access transistor and being electrically coupled to the channel region of the fourth access transistor, wherein the second word line has a side with a vertical length of less than 60 nanometers facing the channel region of the fourth access transistor, and the first and second word lines being buried within the dielectric material in the isolation trench and located below an active silicon surface of the memory cell, wherein the first and second access transistors each are formed as a vertical structure on the first bit line, and the third and fourth access transistors each are formed as a vertical structure on the second bit line.

11. A memory array fabricated on a semiconductor substrate, the memory array comprising:

a plurality of bit lines on the substrate;

a plurality of word lines;

a plurality of memory cells, each of the memory cells including an access transistor having first and second source/drain regions and a channel region, first and second ones of the access transistors each being formed on a first one of the bit lines, and third and fourth ones of the access transistors each being formed on a second one of the bit lines; and at least one isolation trench extending orthogonally to the first and second bit lines, the isolation trench including a dielectric material for providing isolation between the first and second access transistors and for providing isolation between the third and fourth access transistors;

at first one of the word lines extending within the isolation trench in the proximity of the first and third access transistors, the first word line being electrically coupled to the channel region of the first access transistor, wherein the first word line has a side with a vertical length of less than 60 nanometers facing the channel region, and the first word line being electrically isolated from the channel region of the third access transistor;

and a second one of the word lines extending within the isolation trench in parallel with the first word line and spaced apart from the first word line, the second word line extending in the proximity of the second and fourth access transistors, the second word line being isolated from the channel region of the second access transistor and being electrically coupled to the channel region of the fourth access transistor, wherein the second word line has a side with a vertical length of less than 60 nanometers facing the channel region of the fourth access transistor, and the first and second word lines being buried within the dielectric material in the isolation trench and located below an active silicon surface of the memory cell, wherein the first bit line functions as the first source/drain region for the first and second access transistors, and the second bit line functions as the first source/drain region for the third and fourth access transistors.

12. A memory array fabricated on a semiconductor substrate, the memory array comprising:

a plurality of bit lines on the substrate;

a plurality of word lines;

a plurality of memory cells, each of the memory cells including an access transistor having first and second source/drain regions and a channel region, first and second ones of the access transistors each being formed on a first one of the bit lines, and third and fourth ones of the access transistors each being formed on a second one of the bit lines; and at least one isolation trench extending orthogonally to the first and second bit lines, the isolation trench including a dielectric material for providing isolation between the first and second access transistors and for providing isolation between the third and fourth access transistors;

at first one of the word lines extending within the isolation trench in the proximity of the first and third access transistors, the first word line being electrically coupled to the channel region of the first access transistor, wherein the first word line has a side with a vertical length of less than 60 nanometers facing the channel region, and the first word line being electrically isolated from the channel region of the third access transistor;

and a second one of the word lines extending within the isolation trench in parallel with the first word line and spaced apart from the first word line, the second word line extending in the proximity of the second and fourth access transistors, the second word line being isolated from the channel region of the second access transistor and being electrically coupled to the channel region of the fourth access transistor, wherein the second word line has a side with a vertical length of less than 60 nanometers facing the channel region of the fourth access transistor, and the first and second word lines being buried within the dielectric material in the isolation trench and located below an active silicon surface of the memory cell, including a gate oxide layer formed on a sidewall of the first access transistor and interposed between the first word line and the channel region of the first access transistor, a gate oxide layer formed on a sidewall of the fourth access transistor and interposed between the second word line and the channel region of the fourth access transistor, and a layer of a dielectric material interposed between the channel region of the second access transistor and the first word line and between the channel region of the third access transistor and the second word line.

13. A memory array fabricated on a semiconductor substrate, the memory array comprising:

a plurality of bit lines on the substrate;

a plurality of word lines;

a plurality of memory cells, each of the memory cells including an access transistor having first and second source/drain regions and a channel region, first and second ones of the access transistors each being formed on a first one of the bit lines, and third and fourth ones of the access transistors each being formed on a second one of the bit lines; and at least one isolation trench extending orthogonally to the first and second bit lines, the isolation trench including a dielectric material for providing isolation between the first and second access transistors and for providing isolation between the third and fourth access transistors;

at first one of the word lines extending within the isolation trench in the proximity of the first and third access transistors, the first word line being electrically coupled to the channel region of the first access transistor, wherein the first word line has a side with a vertical length of less than 60 nanometers facing the channel region, and the first word line being electrically isolated from the channel region of the third access transistor;

and a second one of the word lines extending within the isolation trench in parallel with the first word line and spaced apart from the first word line, the second word line extending in the proximity of the second and fourth access transistors, the second word line being isolated from the channel region of the second access transistor and being electrically coupled to the channel region of the fourth access transistor, wherein the second word line has a side with a vertical length of less than 60 nanometers facing the channel region of the fourth access transistor, and the first and second word lines being buried within the dielectric material in the isolation trench and located below an active silicon surface of the memory cell, including a layer of a dielectric material interposed between the bit lines and the substrate for electrically isolating the bit lines, and the access transistors formed on the bit lines, from the substrate.

14. A folded bit line semiconductor memory array fabricated on a semiconductor substrate, the memory array comprising:

at least first and second bit lines on the substrate, the first and second bit lines each having a width F which corresponds to a minimum feature size for the semiconductor memory array;

at least first and second access transistors formed on each of the bit lines, each of the access transistors being formed as a vertical structure to have first and second source/drain regions and a vertical channel region located in a generally vertical sidewall portion on only one side of the vertical structure of the access transistor, the length and the width of each access transistor corresponding to the minimum feature size F;

a dielectrically lined trench extending orthogonally to the bit lines between the first and second access transistors on the first and second bit lines;

a gate oxide overlying the channel region of the first access transistor on the first and second bit lines; and first and second word lines in each trench, the word lines being oriented horizontally in the trench, the first and second word lines being electrically coupled to the channel region of respective ones of the first access transistors on the first and second bit lines and being electrically isolated from the channel region of respective ones of the second access transistors on the first and second bit lines.

15. The folded bit line semiconductor memory array of claim 14, wherein the horizontally oriented word lines have a vertical edge opposing the channel regions, and wherein the vertical edge has a vertical height of less than 60 nanometers.

16. A semiconductor memory device comprising:

a memory array fabricated on a semiconductor substrate and including a plurality of bit lines, a plurality of word lines, and a plurality of memory cells;

memory array access circuitry for accessing the memory cells;

each of said memory cells including a single access transistor formed as a vertical structure having first and second source/drain regions and a channel region located in a generally vertical sidewall portion on only one side of the vertical structure of the access transistor, first and second ones of the access transistors each being formed on a first one of the bit lines, and third and fourth ones of the access transistors each being formed on a second one of the bit lines; and an isolation trench extending orthogonally to the first and second bit lines, the isolation trench including a dielectric material for providing isolation between the first and second access transistors and for providing isolation between the third and fourth access transistors;

a first one of the word lines extending within the isolation trench in the proximity of the first and third access transistors, the first word line being electrically coupled to the channel region of the first access transistor, wherein the first word line has a side with a vertical length of less than 60 nanometers facing the channel region, and the first word line being electrically isolated from the channel region of the third access transistor; and a second one of the word lines extending within the isolation trench in parallel with the first word line being at approximately equal vertical position and spaced apart from the first word line, the second word line extending in the proximity of the second and fourth access transistors, the second word line being electrically isolated from the channel region of the second access transistor and being electrically coupled to the channel region of the fourth access transistor, wherein the second word line has a side with a vertical length of less than 60 nanometers facing the channel region of the fourth access transistor, and the first and second word lines being buried in the dielectric material in the isolation trench and located below an active silicon surface of the access transistors.

17. The semiconductor memory device of claim 16, wherein each memory cell includes a stacked capacitor on the upper surface of the access transistor.

18. The semiconductor memory device of claim 16, including a layer of a dielectric material interposed between the bit lines and the substrate for electrically isolating the bit lines, and the access transistors formed on the bit lines, from the substrate.

19. The semiconductor memory device of claim 16, wherein the first and second word lines have a horizontal length which is greater than the vertical length of the side facing the channel regions of the first and the fourth access transistors.

20. A semiconductor memory device comprising:

a memory array fabricated on a semiconductor substrate and including a plurality of bit lines, a plurality of word lines, and a plurality of memory cells;

memory array access circuitry for accessing the memory cells;

each of said memory cells including an access transistor having first and second source/drain regions and a channel region, first and second ones of the access transistors each being formed on a first one of the bit lines, and third and fourth ones of the access transistors each being formed on a second one of the bit lines; and an isolation trench extending orthogonally to the first and second bit lines, the isolation trench including a dielectric material for providing isolation between the first and second access transistors and for providing isolation between the third and fourth access transistors;

a first one of the word lines extending within the isolation trench in the proximity of the first and third access transistors, the first word line being electrically coupled to the channel region of the first access transistor, wherein the first word line has a side with a vertical length of less than 60 nanometers facing the channel region, and the first word line being electrically isolated from the channel region of the third access transistor; and a second one of the word lines extending within the isolation trench in parallel with the first word line and spaced apart from the first word line, the second word line extending in the proximity of the second and fourth access transistors, the second word line being electrically isolated from the channel region of the second access transistor and being electrically coupled to the channel region of the fourth access transistor, wherein the second word line has a side with a vertical length of less than 60 nanometers facing the channel region of the fourth access transistor, and the first and second word lines being buried in the dielectric material in the isolation trench and located below an active silicon surface of the access transistors, wherein the first and second access transistors each are formed as a vertical structure on the first bit line, and the third and fourth access transistors each are formed as a vertical structure on the second bit line.

21. A semiconductor memory device comprising:

a memory array fabricated on a semiconductor substrate and including a plurality of bit lines, a plurality of word lines, and a plurality of memory cells;

memory array access circuitry for accessing the memory cells;

each of said memory cells including an access transistor having first and second source/drain regions and a channel region, first and second ones of the access transistors each being formed on a first one of the bit lines, and third and fourth ones of the access transistors each being formed on a second one of the bit lines; and an isolation trench extending orthogonally to the first and second bit lines, the isolation trench including a dielectric material for providing isolation between the first and second access transistors and for providing isolation between the third and fourth access transistors;

a first one of the word lines extending within the isolation trench in the proximity of the first and third access transistors, the first word line being electrically coupled to the channel region of the first access transistor, wherein the first word line has a side with a vertical length of less than 60 nanometers facing the channel region, and the first word line being electrically isolated from the channel region of the third access transistor; and a second one of the word lines extending within the isolation trench in parallel with the first word line and spaced apart from the first word line, the second word line extending in the proximity of the second and fourth access transistors, the second word line being electrically isolated from the channel region of the second access transistor and being electrically coupled to the channel region of the fourth access transistor, wherein the second word line has a side with a vertical length of less than 60 nanometers facing the channel region of the fourth access transistor, and the first and second word lines being buried in the dielectric material in the isolation trench and located below an active silicon surface of the access transistors, wherein the first and second access transistors each are formed as a vertical structure on the first bit line, and the third and fourth access transistors each are formed as a vertical structure on the second bit line, wherein the first bit line functions as the first source/drain region for the first and second access transistors and the second bit line functions as the first source/drain region for the third and fourth access transistors.

22. A semiconductor memory device comprising:

a memory array fabricated on a semiconductor substrate and including a plurality of bit lines, a plurality of word lines, and a plurality of memory cells;

memory array access circuitry for accessing the memory cells;

each of said memory cells including an access transistor having first and second source/drain regions and a channel region, first and second ones of the access transistors each being formed on a first one of the bit lines, and third and fourth ones of the access transistors each being formed on a second one of the bit lines; and an isolation trench extending orthogonally to the first and second bit lines, the isolation trench including a dielectric material for providing isolation between the first and second access transistors and for providing isolation between the third and fourth access transistors;

a first one of the word lines extending within the isolation trench in the proximity of the first and third access transistors, the first word line being electrically coupled to the channel region of the first access transistor, wherein the first word line has a side with a vertical length of less than 60 nanometers facing the channel region, and the first word line being electrically isolated from the channel region of the third access transistor; and a second one of the word lines extending within the isolation trench in parallel with the first word line and spaced apart from the first word line, the second word line extending in the proximity of the second and fourth access transistors, the second word line being electrically isolated from the channel region of the second access transistor and being electrically coupled to the channel region of the fourth access transistor, wherein the second word line has a side with a vertical length of less than 60 nanometers facing the channel region of the fourth access transistor, and the first and second word lines being buried in the dielectric material in the isolation trench and located below an active silicon surface of the access transistors, wherein the first and second access transistors each are formed as a vertical structure on the first bit line, and the third and fourth access transistors each are formed as a vertical structure on the second bit line, including a gate oxide layer formed on a sidewall of the first access transistor and interposed between the first word line and the channel region of the first access transistor, a gate oxide layer formed on a sidewall of the fourth access transistor and interposed between the second word line and the channel region of the fourth access transistor, and a layer of a dielectric material interposed between the channel region of the second access transistor and the first word line and between the channel region of the third access transistor and the second word line.

23. A vertically oriented transistor cell structure fabricated on a substrate of a semiconductor material, the transistor cell comprising:

a bit line on the substrate;

a single transistor fabricated as a vertical structure on a portion of the bit line, the transistor having a first source/drain region defined by said bit line portion, a second source/drain region, and a vertical channel region located in a generally vertical sidewall portion on only one side of the vertical structure of the transistor, the transistor having an upper surface defining an upper active silicon surface for the cell structure;

a gate oxide formed on the sidewall portion of the transistor overlying the vertical channel region of the transistor;

a gate line extending along the sidewall portion of the transistor, with a portion of the gate line being formed on the gate oxide on only one side of the vertical structure, wherein the gate line has a side facing the vertical channel which has a vertical length of less than 60 nanometers; and a second gate line electrically isolated from the transistor extending along a generally vertical sidewall portion of the transistor opposite the vertical channel region, wherein the bit line and the gate lines are located below the active silicon surface of the memory cell structure.

24. The vertically oriented transistor cell structure of claim 23, wherein the vertically oriented transistor cell structure is used in a logic circuit.

25. The vertically oriented transistor cell structure of claim 23, wherein the vertically oriented transistor cell structure is used in an analog circuit.

26. The vertically oriented transistor cell structure of claim 23, wherein the vertically oriented transistor cell structure is adapted for use in a RF and in a mixed mode circuit.

27. The vertically oriented transistor cell structure of claim 23, wherein the gate line has a horizontal length which is greater than the vertical length of the side facing the vertical channel.

* * * * *

UNITED STATES PATENT AND TRADEMARK OFFICE
CERTIFICATE OF CORRECTION

PATENT NO. : 6,476,434 B1
DATED : November 5, 2002
INVENTOR(S) : Leonard Forbes, Wendell P. Noble and Kie Y. Ahn It is certified that error appears in the above-identified patent and that said Letters Patent is hereby corrected as shown below:

Column 1,
Line 20, insert -- . -- after "element".
Line 24, delete "Well" and insert -- Wells, --, therefor.
Line 29, delete "." after "A", therefor.
Line 53, insert -- , -- after "9.1.3".

Column 4,
Line 40, delete "44" and insert -- 4-4 --, therefor.

Column 9,
Line 9, delete "Filly" and insert -- Fully --, therefor.

Column 20,
Line 6, delete "a" before "RF" and insert -- an --, therefor.

Signed and Sealed this

Seventeenth Day of June, 2003

JAMES E. ROGAN
*Director of the United States Patent and Trademark Office*